(12) United States Patent
Hayashi et al.

(10) Patent No.: US 9,123,863 B2
(45) Date of Patent: Sep. 1, 2015

(54) GROUP 13 NITRIDE CRYSTAL AND SUBSTRATE THEREOF

(75) Inventors: Masahiro Hayashi, Miyagi (JP); Seiji Sarayama, Miyagi (JP); Takashi Satoh, Miyagi (JP); Hiroshi Nambu, Kanagawa (JP); Chiharu Kimura, Miyagi (JP); Naoya Miyoshi, Miyagi (JP)

(73) Assignee: RICOH COMPANY, LTD., Tokyo (JP)

(*) Notice: Subject to any disclaimer, the term of this patent is extended or adjusted under 35 U.S.C. 154(b) by 114 days.

(21) Appl. No.: 13/603,678

(22) Filed: Sep. 5, 2012

(65) Prior Publication Data

US 2013/0062660 A1   Mar. 14, 2013

(30) Foreign Application Priority Data

Sep. 14, 2011   (JP) ................................. 2011-201195

(51) Int. Cl.
| | |
|---|---|
| H01L 33/32 | (2010.01) |
| H01L 29/04 | (2006.01) |
| H01L 33/00 | (2010.01) |
| H01L 29/20 | (2006.01) |
| H01L 33/38 | (2010.01) |
| H01L 33/18 | (2010.01) |
| H01L 33/24 | (2010.01) |

(52) U.S. Cl.
CPC .............. H01L 33/32 (2013.01); H01L 29/045 (2013.01); H01L 29/2003 (2013.01); H01L 33/0025 (2013.01); H01L 33/18 (2013.01); H01L 33/24 (2013.01)

(58) Field of Classification Search
CPC ..................... H01L 21/0254; H01L 21/02516; H01L 33/16; H01L 33/32
USPC .......................................................... 257/103
See application file for complete search history.

(56) References Cited

U.S. PATENT DOCUMENTS

| | | | |
|---|---|---|---|
| 7,482,674 B1* | 1/2009 | Freitas et al. ................. | 257/613 |
| 2001/0024871 A1* | 9/2001 | Yagi .............................. | 438/604 |
| 2003/0164138 A1 | 9/2003 | Sarayama et al. | |
| 2003/0209722 A1* | 11/2003 | Hatakoshi et al. .............. | 257/98 |
| 2004/0134413 A1 | 7/2004 | Iwata et al. | |
| 2004/0226503 A1 | 11/2004 | Iwata et al. | |
| 2006/0006395 A1 | 1/2006 | Kobayashi et al. | |

(Continued)

FOREIGN PATENT DOCUMENTS

| | | |
|---|---|---|
| JP | 2006-45047 | 2/2006 |
| JP | 2008-94704 | 4/2008 |

(Continued)

OTHER PUBLICATIONS

Hisanori Yamane, et al., "Preparation of GaN Single Crystals Using a Na Flux," Chemistry of Materials vol. 9, 1997, pp. 413-416.

*Primary Examiner* — Julia Slutsker
*Assistant Examiner* — Natalia Gondarenko
(74) *Attorney, Agent, or Firm* — Cooper & Dunham LLP

(57) ABSTRACT

A group 13 nitride crystal has a hexagonal crystal structure and at least contains nitrogen atom and at least a kind of metal atoms selected from a group consisting of B, Al, Ga, In, and Tl. The group 13 nitride crystal includes a first region located at an inner side of a cross section intersecting a c-axis, and a second region surrounding at least a part of an outer periphery of the first region, having a thickness larger than a maximum diameter of the first region, and having a carrier density higher than that of the first region.

8 Claims, 12 Drawing Sheets

(56) References Cited

U.S. PATENT DOCUMENTS

| | | |
|---|---|---|
| 2007/0034143 A1 | 2/2007 | Sarayama et al. |
| 2007/0084399 A1 | 4/2007 | Sarayama et al. |
| 2007/0128746 A1 | 6/2007 | Iwata et al. |
| 2007/0194408 A1 | 8/2007 | Iwata et al. |
| 2007/0215034 A1 | 9/2007 | Iwata et al. |
| 2007/0266928 A1 | 11/2007 | Iwata et al. |
| 2008/0081015 A1* | 4/2008 | Sarayama et al. ............ 423/409 |
| 2008/0216737 A1 | 9/2008 | Sarayama et al. |
| 2008/0220346 A1 | 9/2008 | Sarayama et al. |
| 2008/0264331 A1 | 10/2008 | Iwata et al. |
| 2009/0127539 A1* | 5/2009 | Shakuda ........................ 257/13 |
| 2009/0215248 A1* | 8/2009 | Nakahata et al. ............. 438/481 |
| 2009/0249997 A1 | 10/2009 | Sarayama et al. |
| 2010/0102330 A1* | 4/2010 | Motoki et al. .................. 257/76 |
| 2010/0155902 A1* | 6/2010 | Okahisa et al. ................ 257/615 |
| 2010/0163840 A1* | 7/2010 | Seifert et al. .................... 257/13 |
| 2010/0229787 A1 | 9/2010 | Sarayama et al. |
| 2011/0012235 A1 | 1/2011 | Iwata et al. |
| 2011/0062430 A1* | 3/2011 | van Veggel et al. ............. 257/40 |
| 2011/0253034 A1 | 10/2011 | Iwata et al. |
| 2012/0003446 A1 | 1/2012 | Satoh et al. |
| 2012/0085279 A1 | 4/2012 | Sarayama et al. |

FOREIGN PATENT DOCUMENTS

| | | |
|---|---|---|
| JP | 2008094704 A * | 4/2008 |
| JP | 2009-126771 | 6/2009 |
| JP | 2011-213579 | 10/2011 |
| JP | 2012-12259 | 1/2012 |

* cited by examiner

A-A CROSS SECTION

A-A CROSS SECTION (A)　　　　　　　　(B)　　　　　　　(C)

GROUP 13 NITRIDE CRYSTAL AND SUBSTRATE THEREOF

CROSS-REFERENCE TO RELATED APPLICATIONS

The present application claims priority to and incorporates by reference the entire contents of Japanese Patent Application No. 2011-201195 filed in Japan on Sep. 14, 2011.

BACKGROUND OF THE INVENTION

1. Field of the Invention

The present invention relates to a group 13 nitride crystal, and a group 13 nitride crystal substrate.

2. Description of the Related Art

Semiconductor materials based on gallium nitride (GaN) are used for blue color LED (light-emitting diode) or white color LED, and a semiconductor device such as semiconductor laser (also called "LD: Laser Diode"). The white color LED is used for illumination purpose or back lighting of cell phones, LC (Liquid Crystal) display or the like. The blue color LED is used for traffic lights or other illumination purpose and so on. On the other hand, blue-violet semiconductor laser is used as light sources of Blu-ray discs. Presently, most of semiconductor devices based on GaN used as light sources of UV or violet-blue-green color are fabricated by using MO-CVD (Metalorganic Chemical Vapor Deposition) method or MBE (Molecular Beam Epitaxy) method to grow crystal on sapphire or SiC substrate.

There are problems in a case that sapphire or SiC is used as substrate. Crystal defects increases because of the significant difference of thermal expansion coefficient or lattice constant between the substrate and the group 13 nitride. Such a defect affects device properties. For example, it becomes harder to elongate the lifetime of emitting device. And, the operating power may increase. In order to address these problems, it is the most preferable to use a gallium nitride substrate which is made of the same material as crystal to be grown on the substrate.

Presently, free-standing GaN substrates are manufactured in such a manner that a thick gallium nitride crystal is grown on a hetero-substrate such as sapphire substrate or GaAs substrate by HVPE (Hydride Vapor Phase Epitaxy) with employing ELO (Epitaxial Lateral Overgrowth) which is a method to reduce the dislocation density, and then the thick film of gallium nitride is separated from the hetero-substrate. The gallium nitride substrate manufactured as such has a dislocation density reduced to the order of $10^6$ cm$^{-2}$, and allows a size up to 2 inches in practical use mainly for laser device purpose. Recently, there is a further need for much larger diameter of substrate up to 4 inches or 6 inches for electronic devices, or cost saving of white color LEDs.

Warpage or cracks which may be induced by the difference of the thermal expansion coefficient or the lattice constant between the hetero-substrate and the gallium nitride hinders to enlarge the diameter of substrate. The aforementioned dislocation density still remains. There is also a problem of high manufacturing cost in processes of separating one thick film of gallium nitride from one hetero-substrate, and polishing it to form the gallium nitride substrate.

On the other hand, as one of liquid phase methods to realize the gallium nitride substrate, many efforts have been made for developing the flux method in which the gallium nitride crystal is formed by dissolving the nitrogen from a gaseous phase into a molten mixture of group 13 metal and alkali metal. In the flux method, a molten mixture containing the alkali metal such as sodium (Na) and potassium (K) and the group 13 metal such as gallium (Ga) is heated to about 600 to 900 degrees Celsius under an atmosphere where the nitrogen pressure is 10 MPa or less. Thus, the nitrogen is dissolved from the gaseous phase and reacts with the group 13 metal in the molten mixture to form the group 13 nitride crystal. The flux method allows a crystal growth with a lower temperature and lower pressure in comparison with ether liquid phase methods. The crystal formed by the flux method has a low dislocation density advantageously lower than $10^6$ cm$^{-2}$.

There is a report that gallium nitride crystal is formed under conditions that sodium azide (NaN$_3$) and metal Ga which are used as source materials are put and sealed in a reactor vessel made of stainless steel (as for sizes inside of the vessel, inner diameter is 7.5 mm, length is 100 mm) under a nitrogen atmosphere, and the reactor vessel is retained at 600 to 800 degrees Celsius for 24 to 100 hours (Chemistry of Materials Vol. 9 (1997) 413-416).

Japanese Patent Application Laid-open No. 2008-94704 discloses a method of manufacturing a column-like crystal of gallium nitride by using a needle-like crystal of aluminum nitride (AlN) as seed crystal in order to provide a large crystal of gallium nitride. Japanese Patent Application Laid-open No. 2006-045047 discloses a method of manufacturing a needle-like crystal of aluminum nitride which becomes a seed crystal. Japanese Patent Application Laid-open No. 2009-126771 discloses a seed crystal of which a yellow emission effect is observed, and a gallium nitride crystal which is formed on the seed crystal and has a crystal layer of which a yellow emission effect is not observed.

In a case that gallium nitride crystal is formed from aluminum nitride as seed crystal, however, the difference of lattice constant between aluminum nitride and gallium nitride may arise dislocations due to the lattice mismatch. Since thermal expansion coefficient is also different between aluminum nitride and gallium nitride, thermal stress may arise new dislocations or even cracks, in the course of cooling from a crystal growth temperature to a room temperature.

Therefore, it is preferable to use gallium nitride crystal as seed crystal which has the same lattice constant or the same thermal expansion coefficient with the target crystal, in order to grow a high quality gallium nitride crystal with low dislocation density. However, it is difficult to grow a needle-like crystal of gallium nitride by the method disclosed in Japanese Patent Application Laid-open No. 2006-045047. Therefore, it is difficult to obtain a high quality bulk crystal by any conventional method.

SUMMARY OF THE INVENTION

It is an object of the present invention to at least partially solve the problems in the conventional technology.

A group 13 nitride crystal has a hexagonal crystal structure and at least contains nitrogen atom and at least a kind of metal atoms selected from a group consisting of B, Al, Ga, in, and Tl. The group 13 nitride crystal includes a first region located at an inner side of a cross section intersecting a c-axis, and a second region surrounding at least a part of an outer periphery of the first region, having a thickness larger than a maximum diameter of the first region, and having a carrier density higher than that of the first region.

A group 13 nitride crystal substrate includes at least the second region of the aforementioned group 13 nitride crystal.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
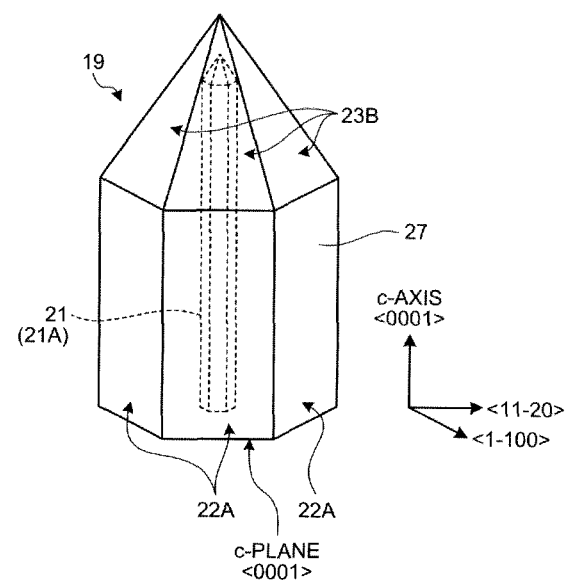
FIG. 1 is a perspective view schematically illustrating a structure of a group 13 nitride crystal.

Now an explanation will be made on a group 13 nitride crystal and a group 13 nitride crystal substrate according to an embodiment, with reference to the accompanying drawings. The accompanying drawings herein only schematically show shapes, sizes and arrangements of constituents, elements or components to an extent necessary for a clear understanding of the present invention. However, these drawings shall not be considered any limitation to the present invention. Identical reference numerals are given to the same or corresponding constituents, elements or components among the plurality of drawings, while the redundant explanation may be omitted as appropriate.

The group 13 nitride crystal according to the embodiment is a group 13 nitride crystal having a hexagonal crystal structure containing at least a nitrogen atom and at least a kind of metal atoms selected from a group of B (boron), Al (aluminum), Ga (gallium), In (indium), and Tl (thallium). The group 13 nitride crystal according to the embodiment has a first region and a second region. The first region is located at an inner area of a cross section intersecting the c-axis of the group 13 nitride crystal. The second region surrounds at least a part of the outer circumference of the first region in the cross section intersecting the c-axis and has a thickness larger than the maximum diameter of the first region in the cross section intersecting the c-axis. The second region has a carrier density higher than that of the first region.

The group 13 nitride crystal according to the embodiment has the second region which has the carrier density higher than that of the first region. Thereby, it is considered that the embodiment can provide a high quality group 13 nitride crystal advantageously applicable to a low resistance conductive device or the like by using the second region.

The "high quality group 13 nitride crystal" means that there is fewer defect such as dislocation in an outermost region of the cross section intersecting the c-axis in comparison with an inner region, and the outermost region has a carrier density higher than that of the inner region. The outermost region refers to a partial region which continuously extends from the outer edge to the inner side in the cross section intersecting the c-axis of the group 13 nitride crystal. The outermost region corresponds to the second region. The inner region or innermost region refers to a region which is used as a seed crystal in the cross section. Specifically, the innermost region corresponds to the first region and a fourth region, which will be described later.

More detail explanation will be given below.

[1] Group 13 Nitride Crystal

As mentioned above, the group 13 nitride crystal according to the embodiment is a group 13 nitride crystal having a hexagonal crystal structure containing at least a nitrogen atom and at least a kind of metal atoms selected from a group of B (boron), Al (aluminum), Ga (gallium), In (indium), and Tl (thallium). The group 13 nitride crystal according to the embodiment preferably contains at least one of Ga and Al, more preferably contains at least Ga, as metal atom.

Figure 2:
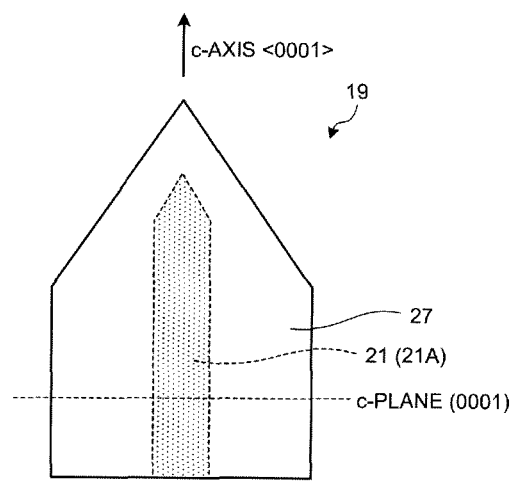
FIG. 2 is a sectional view of an exemplary cross section parallel to the c-axis and the a-axis of the group 13 nitride crystal.
Figure 3:
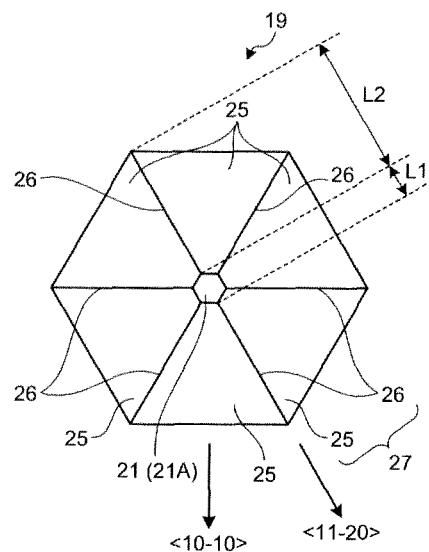
FIG. 3 is a sectional view an exemplary c-plane {0001} cross section of the group 13 nitride crystal.

FIG. 1 to FIG. 3 show an example of the group 13 nitride crystal 19 according to the embodiment. Specifically, FIG. 1 shows schematically an exemplary structure of the group 13 nitride crystal 19 according to the embodiment. FIG. 2 shows a cross section parallel to an a-axis and the c-axis of the group 13 nitride crystal 19. FIG. 3 shows a c-plane cross section which is a cross section parallel to a c-plane of the group 13 nitride crystal 19.

As illustrated in FIG. 3, the c-plane cross section of the group 13 nitride crystal has a hexagonal shape. The hexagonal shape herein refers to all types of hexagonal shape including regular hexagon and other hexagons. Side surfaces of the group 13 nitride crystal 19, which correspond to edges of the hexagonal shape, are mainly comprised of m-planes {10-10} (see 22A in FIG. 1).

In FIG. 1, the group 13 nitride crystal 19 is illustrated as a column-like structure in which a six-sided pyramid having a bottom surface corresponding to c-plane (0001) and a central axis corresponding to c-axis (i.e. <0001> direction) is placed upon a hexagonal column-like crystal having a bottom surface corresponding to c-plane (0001) and a central axis corresponding to c-axis. However, the group 13 nitride crystal 19 is not limited to the column-like crystal, insofar as it has a hexagonal crystal structure. For example, a c-plane may be formed at a tip of the six-sided pyramid of the group 13 nitride crystal 19 in an example of FIG. 1.

Although the group 13 nitride crystal according to the embodiment is a single crystal, it has the first region 21 and the second region 27. The first region 21 is a region located at the inner side of the group 13 nitride crystal 19 in the c-plane cross section. The first region 21 is a seed crystal. The second region 27 is a crystal region grown from the seed crystal.

It is enough for the group 13 nitride crystal 19 to have the first region and the second region in at least one plane intersecting the c-axis. It is not limited to the c-plane cross section, precisely.

The second region 27 surrounds at least a part of the outer circumference of the first region 21 in the c-plane cross section of the group 13 nitride crystal 19. It is enough for the second region 27 to surround at least a part of the outer circumference of the first region 21. The second region 27 may surround the entire outer circumference of the first region 21. In an example of FIG. 3, the second region 27 surrounds the entire outer circumference of the first region 21.

The second region 27 has a thickness, in the c-plane cross section, larger than the maximum diameter of the first region 21. The thickness of the second region 27 refers to the maximum thickness that is the maximum length of the second region 27 in a direction from the center of the first region 21 to the outer edge of the group 13 nitride crystal 19 in the cross section parallel to the c-plane. In an example of FIG. 3, the thickness of the second region 27 is represented by the length L2.

The maximum diameter of the first region 21 refers to the maximum value of diameters of the first region 21 and is represented by the length L1 in an example of FIG. 3.

The relationship between the maximum diameter of the first region 21 and the thickness of the second region in the c-plane cross section is not limited to any particular one insofar as the aforementioned relationship is satisfied. However, the thickness of the second region 27 is preferably 5 times or more, more preferably 10 times or more longer than the maximum diameter of the first region 27.

The carrier density of the second region 27 is higher than that of the first region 21. The relationship between the carrier density of the first region 21 and the carrier density of the second region 27 is not limited to any particular one insofar as the aforementioned relationship is satisfied. However, the carrier density of the second region 27 is preferably 5 times or more, more preferably 10 times or more higher than the carrier density of the first region 21.

In the group 13 nitride crystal 19 according to the embodiment, the relationship between the carrier density of the first region 21 and the carrier density of the second region 27 is not limited to any particular one insofar as the aforementioned relationship is satisfied. More specifically, however, the carrier density of the first region 21 is preferably $2\times10^{18}$ cm$^{-3}$ or less, more preferably $8\times10^{17}$ cm$^{-3}$ or less. The carrier density of the second region 27 is preferably $4\times10^{18}$ cm$^{-3}$ or more, more preferably $8\times10^{18}$ cm$^{-3}$ or more.

In the embodiment, the "carrier" refers to electron, and the "carrier density" refers to electronic carrier density.

The carrier densities of the first region 21 and the second region 27 can be measured as follows.

Raman spectroscopy to convert the carrier density is used for the measurement of the carrier densities of the first region 21 and the second region 27. The carrier density can be converted by using a method described in "Characterization of GaN and Related Nitrides by Raman Scattering" (Hiroshi HARIMA, Journal of the Spectroscopical Society of Japan, Vol. 49, No. 5 (2000)). A laser Raman spectrometer can be used as a measurement apparatus.

The carrier densities of the first region 21 and the second region 27 are adjusted or controlled so as to satisfy the aforementioned relationship by controlling the manufacture conditions in manufacturing the group 13 nitride crystal 19, which will be described later. The sizes of the first region 21 and the second region 27 (diameter and thickness) are adjusted or controlled so as to satisfy the aforementioned relationship by controlling the manufacture conditions in manufacturing the group 13 nitride crystal 19, which will be described later.

The second region 27 having the carrier density higher than that of the first region 21 includes a plurality of segmented regions 25 (e.g. domains) and boundary regions (e.g. domain walls) 26.

The segmented regions 25 mean regions each of which is formed by a crystal growth from the corresponding crystal surface (specifically, m-plane) of the first region 21, when the first region 21 is used as the seed crystal having a hexagonal, crystal structure. Specifically, each of the segmented regions 25 is a region which is formed by a crystal growth to <10-10> direction from each m-plane of the seed crystal which is the first region 21 having a crystal structure. Thereby, the segmented regions 25 may be also called "growth sectors". The second region 27 of the group 13 nitride crystal 19 includes six segmented regions 25.

On the other hand, the boundary regions 26 are regions located at boundaries between the adjacent segmented regions 25. That is, the boundary regions 26 are regions corresponding to boundary surfaces between adjacent segmented boundaries 25. The boundary regions 26 are boundary regions between adjacent segmented regions 25 each formed by crystal growth from the corresponding crystal surface (specifically, m-plane) of the seed crystal, when the first region 21 is used as the seed crystal having a hexagonal crystal structure.

Specifically, each of the boundary regions 26 is a region located along a <11-20> direction from a boundary between adjacent m-planes of the seed crystal which is the first region 21 having a hexagonal crystal structure. In the embodiment, the group 13 nitride crystal 19 has a hexagonal crystal structure. Thereby, the second region 27 of the group 13 nitride crystal 19 includes six boundary regions 26.

In the embodiment, the carrier density of each boundary region 26 of the second region 27 is higher than the segmented regions 25 which are continuous with the corresponding boundary region 26. The relationship of carrier densities between the boundary region 26 and the segmented region 25 is a relationship compared between the boundary region 26 and the segmented region 25 which are adjacent to each other.

In the embodiment, the carrier density is uniform in one segmented region. The carrier density is also uniform among segmented regions of one group 13 nitride crystal 19. Each boundary region 26 has a carrier density higher than each segmented region 25.

The group 13 nitride crystal 19 according to the embodiment may include other crystal region, defect and the like in addition to the first region 21 and the second region 27.

The first region 21 of the group 13 nitride crystal 19 according to the embodiment may be comprised of a plurality of regions. For example, as shown in FIG. 4 to FIG. 6, the first region 21A may be used instead of the first region 21.

Figure 4:
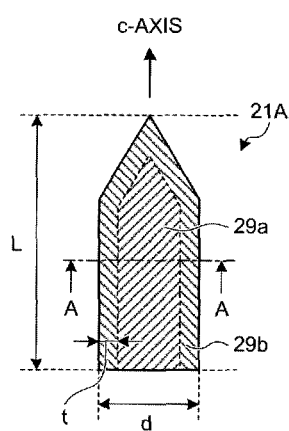
FIG. 4 is a sectional view of an exemplary cross section parallel to the c-axis and the a-axis of seed crystal.
Figure 5:
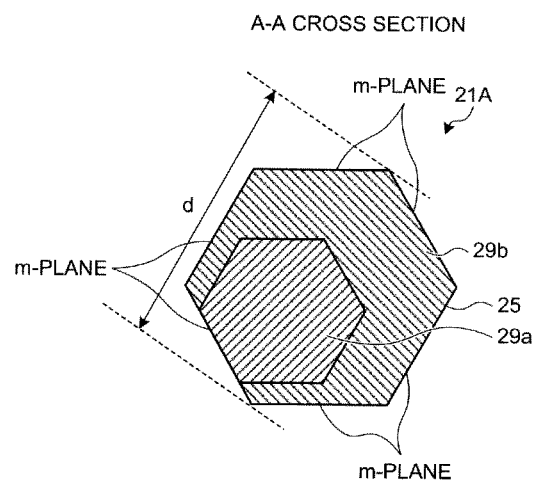
FIG. 5 is a sectional view of an exemplary c-plane cross section of a seed crystal.
Figure 6:
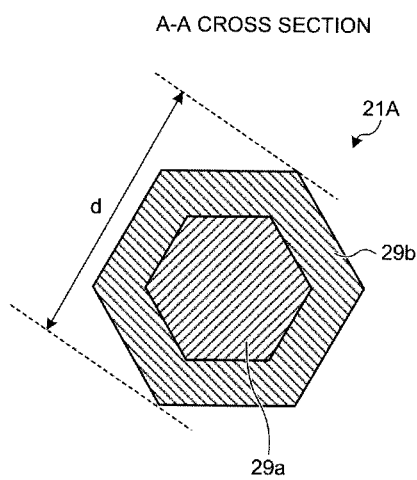
FIG. 6 is another sectional view of an exemplary c-plane cross section of a seed crystal.

FIG. 4 to FIG. 6 show an example of a hexagonal crystal structure of the first region 21A. Specifically, FIG. 4 is a sectional view showing a cross section parallel to the a-axis and the c-axis in the hexagonal crystal structure of the first region 21A. FIG. 5 and FIG. 6 are sectional views showing cross sections parallel to the c-plane in the hexagonal crystal structure of the first region 21A.

The first region 21A includes a third region 29a inside thereof in a c-plane cross section. A fourth region 29b is located surrounding at least a part of the outer circumference of the third region 29a.

It is sufficient that the fourth region 29h is disposed to surround at least a part of the outer circumference of the third region 29a. The fourth region 29b may be disposed so as to surround the entire outer circumference of the third region 29a (see FIG. 6). Alternatively, the third region 29a may have a part of the outer circumference which are not surrounded by the fourth region 29b (see FIG. 5).

Similarly to the aforementioned explanation, it is sufficient that the first region 21A contains the third region 29a and the fourth region 29b in at least one plane intersecting the c-axis. It is not limited to the c-plane cross section.

The thickness of the fourth region 29b is not limited to any particular values. However, it is preferably 100 nm or more.

In a case that, the group 13 nitride crystal is grown from GaN crystal as a seed crystal by a flux method, as described in Japanese Patent Application Laid-open No. 2009-126771, a melt-back of the seed crystal may arise. It is known that an amount of melt-back (melt-back amount) increases when the seed crystal has a low quality, especially the seed crystal includes an affected or damaged layer remained therein.

On the contrary, by disposing 100 nm or more thickness of the fourth region 29b which is a crystal layer with higher quality than the third region 29a at the outer side of the crystal, the fourth region 29b is likely to remain even if the melt-back arises in the growing process of the seed crystal, and thereby the second region 27 with a high quality is likely to be grown.

In FIG. 3, FIG. 5, FIG. 6 and the like, the c-plane cross section or the sectional planes of each region of the group 13 nitride crystal 19 are schematically illustrated as regular hexagon, respectively. However, these figures are only examples and the sectional shape is not limited to the regular hexagon. The c-plane cross section of the group 13 nitride crystal 19, and sectional planes parallel to the c-plane of each region are generally formed into hexagon with a sectional plane of the group 13 nitride crystal 19 having a hexagonal crystal structure. In a case that other structure arises inside or at, the boundary of this hexagonal structure in the crystal growing process, the outline of this hexagonal shape may change by the boundary with the other structures.

The group 13 nitride crystal 19 is comprised of not only the aforementioned regions (the first region 21 or 21A, the second region 27). The group 13 nitride crystal 19 may includes other regions (the Nth region in which N is an integer equal to or larger than 5 in an embodiment) having other optical properties or other structures.

<Properties of Each Region>
—Emitting Property—

In emission spectra with electron beam or UV excitation of the third region 29a and the fourth region 29b in the c-plane cross section of the group 13 nitride crystal 19 according to the embodiment, the peak intensity of the first peak which includes the band edge luminescence of GaN and the peak intensity of the second peak which appears in longer wavelength region than the first peak has a relationship as explained below.

Specifically, the peak intensity of the first peak is smaller than the peak intensity of the second peak in the third region 29a. The peak intensity of the first peak is greater than the peak intensity of the second peak in the forth region 29b.

The peak intensities of the first and second peaks in the third and fourth regions 29a, 29b are not limited to any particular one insofar as the aforementioned relationship is satisfied. More preferably, the peak intensity of the first peak in the fourth region 29b is preferably greater than the peak intensity of the first peak in the third region 29a. The peak intensity of the second peak in the fourth region 29b is preferably is smaller than the peak intensity of the second peak in the third region 29a.

The first peak corresponds to an emission including the hand edge emission of GaN (hereinafter may be called only "band edge emission") in the measurement target area of the group 13 nitride crystal 19, and refers to an emission spectrum peak which appears around about 364 nm when measured at a room temperature. The band edge emission of GaN is an emission due to a recombination of holes in an upper edge of the valence band and electrons in bottom of the conduction band in the group 13 nitride crystal 19, and means that the light having energy (wavelength) equal to the band gap is emitted. In other words, the first peak is a peak due to a periodic structure of the crystal and a combination (status) of nitrogen and gallium in the group 13 nitride crystal 19. The first peak may include an emission in the vicinity of the band edge in addition to the band edge emission.

The second peak refers to at least one peak which appears in a longer wavelength area than the first peak. It is a peak including an emission due to impurities, defects or the like, for example.

In a more preferable embodiment, the second peak appears in a range from 450 nm to 650 nm with respect to an emission spectrum with electron beam or UV excitation when measured at a room temperature.

In a still more preferable embodiment, the second peak appears in a range from 590 nm to 650 nm with respect to an emission spectrum with electron beam or UV excitation when measured at a room temperature.

Figure 7:
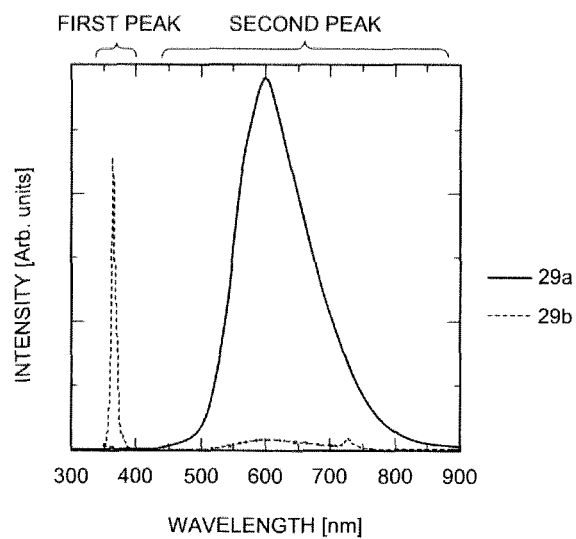
FIG. 7 is exemplary light emission spectra of a third region and a fourth region with electron beam or UV excitation.

FIG. 7 shows an example of emission spectra with electron beam or UV excitation in the third region 29a and the fourth region 29b.

A fact that the second peak has a peak intensity greater than that of the first peak as shown in the emission spectrum of the third region 29a means that the third region 29a contains a relatively large amount of impurities or defects. On the other hand, a fact that the first peak has a peak intensity greater than that of the second peak as shown in the emission spectrum of the fourth region 29b means that the fourth region 29b contains less impurities or defects and thereby the fourth region 29b is a high quality crystal.

In the manufacturing process of the group 13 nitride crystal 19 described later, it is considered that higher quality group 13 nitride crystal 19 can be produced in a case that the first region 21A is used as the seed crystal in comparison with a case that the first region 21 is used as the seed crystal. It is considered that this is because the crystal can be grown upon the fourth region 29b containing less impurities or defects by using the first region 21A as the seed crystal in which the fourth region 29b containing less impurities or defects is disposed outside.

Since the crystal can be grown from a region contacting the fourth region 29b containing less impurities or defects than the third region 29a when forming a larger group 13 nitride crystal 19 from the first region 21A as the seed crystal, a larger amount or size of the second region 21 can be obtained with a high crystal quality.

In the embodiment, impurities means B, Al, O, Ti, Cu, Zn, Si, Na, K, Mg, Ca, W, C, Fe, Cr, Ni, H and so on.

—Boron Density—

The boron density of the third region 29a is higher than that of the fourth region 29b. Specifically, the boron density of the third region 29a is preferably $4\times10^{18}$ the boron density of the fourth region 29b Located outside of the third region 29a is preferably less than $4\times10^8$ atms/cm$^3$, for example.

More preferably, the boron density of the third region 29a is $6\times10^{18}$ atms/cm$^3$ or more, and the boron density of the fourth region 29b is less than $1\times10^{18}$ atms/cm$^3$.

If the boron density satisfies the aforementioned relationship, the crystal growth can be started mainly from an outer circumference surface of the fourth region 29b which is a high quality crystal and has a low boron density, in a case that the group 13 nitride crystal 19 is grown from the first region 21A as the seed crystal in which the fourth region 29b is disposed outside of the third region 29a. Therefore, it is possible to produce a high quality group 13 nitride crystal 19, also in a case that a group 13 nitride crystal 19 elongated in the c-axis direction is manufactured by using the first region 21A as the seed crystal which is elongated in the c-axis direction by doping or adding the boron.

<Manufacturing Process>

Now, a manufacturing process of the group 13 nitride crystal 19 will be explained.

The group 13 nitride crystal 19 is manufactured by a crystal growth from the first region 21 or 21A which is used as the seed crystal.

The first region 21 or 21A as the seed crystal has a hexagonal crystal structure and is elongated in the c-axis direction. The first region 21 or 21A as the seed crystal has a hexagonal cross section orthogonal to the c-axis (called "c-plane cross section"). Side surfaces of the seed crystal which correspond to edges of the hexagonal shape are comprised mainly of the m-planes of the hexagonal crystal structure.

Hereafter, the manufacturing process is explained in detail.

[2] Crystal Growth Process of Seed Crystal

<Crystal Manufacturing Apparatus>

Figure 8:
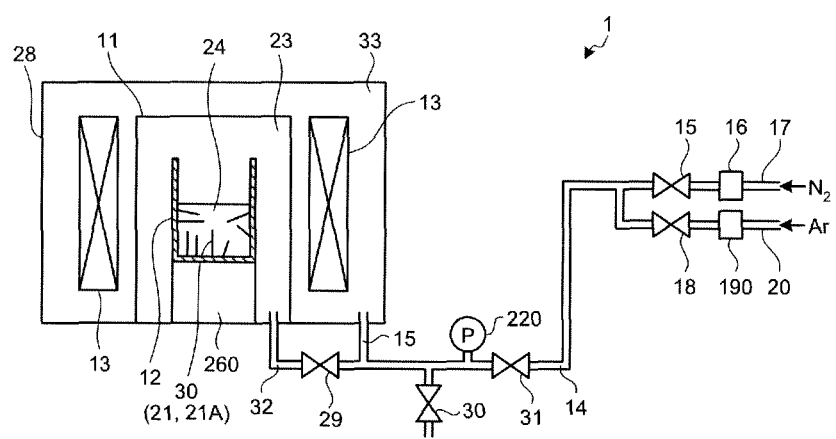
FIG. 8 is a schematic sectional view illustrating a crystal manufacturing apparatus to form a seed crystal.

FIG. 8 schematically shows a crystal manufacturing apparatus 1 to produce a seed crystal 30 such as the first region 21 or 21A. Hereinafter, the first region 21 or 21A as the seed crystal is collectively referred to as the seed crystal 30.

As shown in FIG. 8, the crystal manufacturing apparatus 1 has a double vessel structure in which an inner vessel 11 is disposed in an outside pressure resistant vessel 28 made of stainless material, and a reactor vessel 12 is disposed in the inner vessel 11. The inner vessel 11 is attachable to and detachable from the outside pressure resistant vessel 28.

The reactor vessel 12 is for maintaining a molten mixture 24 obtained by melting source material(s) or additive(s) in order to obtain the seed crystal 30. The configuration of the reactor vessel 12 will be described later.

To the outside pressure resistant vessel 28 and the inner vessel 11, gas pipes 15 and 32 are respectively connected to supply nitrogen ($N_2$) gas which is source material of the group 13 nitride crystal and a diluent gas for controlling a whole pressure to an inner space 33 of the outside vessel 28 and an inner space 23 of the inner vessel 11. A gas supplying pipe 14 is branched into a nitrogen supplying pipe 17 and a diluent gas supplying pipe 20 via valves 15 and 18, respectively. These pipes 17 and 20 can be separated at valves 15 and 18, respectively.

Argon (Ar) gas which is inert gas is preferably used as the diluent gas. However, the embodiment is not limited to this. For example, other inert gas such as helium (He) may be used as the diluent gas.

The nitrogen gas is introduced from the nitrogen supplying pipe 17 which is connected to a gas canister or the like containing the nitrogen gas therein. The nitrogen gas from the pipe 17 is subjected to a pressure control by a pressure regulator 16 and then supplied to the gas supplying pipe 14 via the valve 15. On the other hand, the diluent gas (e.g. Ar gas) is introduced from the diluent gas supplying pipe 20 which is connected to a gas canister or the like containing the diluent gas therein. The diluent gas from the pipe 20 is subjected to a pressure control by a pressure regulator 190 and then supplied to the gas supplying pipe 14 via the valve 18. Thus, the pressure regulated nitrogen gas and the pressure regulated diluent gas are supplied to the gas pipe 14 to be mixed there.

The gas mixture of the nitrogen gas and the diluent gas is supplied to the outside vessel 28 via the pipe 15 and the inner vessel 11 via the pipe 32. The inner vessel 11 can be removed from the apparatus 1 at the valve 29.

A pressure meter 220 is disposed on the pipe 14 for monitoring a whole pressure inside of the outside vessel 28 and the inner vessel 11 and controlling pressures inside of the outside vessel 28 and inner vessel 11.

In the embodiment, nitrogen partial pressure can be controlled by controlling the pressures of the nitrogen gas and the diluent gas by means of valves 15 and 18 and the pressure regulators 16 and 190. Since the whole pressure of the outside vessel 28 and the inner vessel 11 can be controlled, it is possible to reduce evaporation of alkali metal (e.g. sodium) in the reactor vessel 12 by increasing the whole pressure of the inner vessel 11. In other words, it is possible to control separately the nitrogen partial pressure which becomes a nitrogen source affecting the crystal growth condition of GaN and the whole pressure which affects the reduction of sodium evaporation.

As shown in FIG. 8, a heater 13 is disposed around the outer circumference of the inner vessel 11 inside of the outside vessel 28 for heating the inner vessel 11 and the reactor vessel 12 and controlling the temperature of the molten mixture 24.

In the embodiment, the seed crystal 30 is manufactured by a flux method. Now, an explanation will be made on a case that the seed crystal 30 is manufactured as the seed crystal of the first region 21A (including the third region 29a and the fourth region 29b).

In a case that the first region 21A is manufactured as the seed crystal 30, boron is melted into the molten mixture 24, the boron is taken into the crystal while the GaN crystal 25 is grown, and the boron density in the molten mixture 24 is reduced during the crystal growth process, in order to grow the crystal with a different boron densities between the inner side and the outer side of the seed crystal 30.

In a case that the first region 21 is manufactured as the seed crystal, boron is melted into the molten mixture 24, and the boron is taken into the crystal while the GaN crystal 25 is grown. There is no need to reduce the boron density in the molten mixture during the crystal growth process. Therefore, the following explanation is for manufacturing the first region 21A as the seed crystal 30.

In a process to melt the boron, the boron is melted molten mixture 24 from boron nitride (BN) contained in the inner wall of the reactor vessel 12 or from a boron nitride component disposed inside of the reactor vessel 12. Then, the melted boron is taken into the crystal while growing. An amount of boron taken into the crystal is gradually reduced as the crystal grows.

Due to a process to reduce the boron density, it is possible to reduce the boron density of the outer region in a cross section intersecting the c-axis in comparison with the boron density of the inner region in the cross section, while the seed crystal 30 grows with growing the m-planes {10-10}. Thereby, the density of boron as an impurity can be reduced and the dislocation density which may be induced by the impurities can be reduced, at the outer circumference surface comprised of the m-planes (six side surfaces of the hexagonal column) of the seed crystal 30. Thus, the outer circumference of the seed crystal 30 can be made of the higher quality crystal in comparison with the inner region.

In a manufacturing process as described in the following [3] to grow the group 13 nitride crystal 19 (specifically, the second region 27) from the seed crystal 30, the group 13 nitride crystal 19 is grown mainly from side surfaces of the seed crystal 30 (the outer circumference surface comprised of m-planes) as start points of the crystal growth. Thereby, if the outer circumference surface comprised of m-planes of the seed crystal 30 is of a good quality as described above, the crystal grown from the surface becomes of a good quality. Therefore, according to the embodiment, it is possible to grow a large and high quality seed crystal 30 and thereby a high quality group 13 nitride crystal 19 (the second region 27).

Next, a further detail explanation will be made on the boron melting, the boron taking and the boron reducing.

(1) Process that Reactor Vessel 12 Contains Boron Nitride

In an example of the boron melting, a reactor vessel 12 made of a sintered BN (sintered boron nitride) can be used as the reactor vessel 12. In the course of heating the reactor vessel 12 to a crystal growth temperature, boron is melted from the reactor vessel 12 into the molten mixture 24 (the boron melting process). Then, the boron in the molten mixture 24 is taken into the seed crystal 27 in the course of growing the seed crystal 30 (the boron taking process). The boron in the molten mixture is gradually reduced as the seed crystal 30 grows (the boron reducing process).

In the aforementioned example, the reactor vessel 12 made of the sintered BN is used. However, the reactor vessel 12 is not limited to this. In a preferable embodiment, it is sufficient that the reactor vessel 12 includes a BN-contained material (e.g. sintered BN) at a part at least of its inner wall contacting the molten mixture 24. The other part of the reactor vessel 12 may be made of nitride such as pyrolytic BN (P-BN) and the like, oxide such as alumina, YAG and the like, carbide such as SiC and the like.

(2) Process that BN-Contained Material is Placed in the Reactor Vessel 12

In another example of melting the boron, a BN-contained material may be placed in the reactor vessel 12. As an example, a sintered BN may be placed in the reactor vessel 12. Materials for the reactor vessel 12 are not limited to any particular one similarly to the process (1).

In this process, in the course of heating the reactor vessel 12 to a crystal growth temperature, boron is gradually melted from the material placed in the reactor vessel 12 into the molten mixture 24 (the boron melting process).

In the processes (1) and (2), crystal nuclei of GaN crystal are likely to be formed on a surface of the RN-contained material contacting the molten mixture 24. Therefore, if the BN surface (i.e. the inner wall surface or the material surface) is gradually covered with the GaN crystal nuclei formed thereon, the amount of boron melted from the covered BN material into the molten mixture 24 gradually decreases (the boron reducing process). Furthermore, in accordance with the growth of the GaN crystal, a surface area of the crystal gradually increases and thereby the density of boron which is taken into the GaN crystal decreases (the boron reducing process).

In the processes (1) and (2), the boron-contained material is used for melting the boron into the molten mixture 24. A method or process for melting the boron into the molten mixture 24 is not limited to this. For example, boron may be added into the molten mixture 24, or any other process may be used. As for a method or process for reducing the boron density in the molten mixture 24, any other method or process may be used. The crystal manufacturing process according to the embodiment sufficiently includes the boron melting process, the boron taking process and the boron reducing process, as mentioned above at least.

<Preparation of Materials or the like, and Crystal Growth Conditions>

An operation to put the source material or the like into the reactor vessel 12 is conducted in such a manner that the pressure resistant vessel 11 is put into a glove box under an inert gas atmosphere such as Ar.

In a case that the seed crystal 30 is grown by the process (1), the boron-contained material as explained in the process (1), a material used as a flux, and source material(s) are put into the reactor vessel 12 as explained in the process (1).

In a case that the seed crystal 30 is grown by the process (2), a material used as a flux and source materials) are put into the reactor vessel 12 as explained in tree process (2).

In a case that the seed crystal 30 is grown by the process (3), a BN-contained material as explained in the process (3), a material used as a flux and source material(s) are put into the reactor vessel 12 as explained in the process (3).

The material used as flux may be sodium, or sodium compound (e.g. sodium azide). Any other material including other alkali metals such as lithium and potassium, or compounds of these alkali metals may be used as the flux. Furthermore, alkali earth metals such as barium, strontium, and magnesium, or compounds of these alkali earth metals may be used as the flux. A plurality kind of alkali metals or alkali earth metals may be used.

As the source material, gallium ed. Any other materials including without limitation other group 13 elements such as boron, aluminum and indium, or mixtures thereof may be used as source material(s) to be put into the reactor vessel 12.

In the embodiment, the reactor vessel 12 contains boron. The reactor vessel 12 may further contain at least one from B, Al, O, Ti, Cu, Zn, and Si, without limiting to only boron.

After setting the source material(s) and others as mentioned above, the inner vessel 11 and the reactor vessel 12 inside of the inner vessel 11 are heated to a crystal growth temperature by turning on the heater 13. Then, the source material is melted with the material used as the flux in the reactor vessel 12 to form the molten mixture 24. Nitrogen as the source material of the seed crystal 30 can be supplied to the molten mixture 24 by bring the nitrogen having the aforementioned partial pressure into contact with the molten mixture 24 and thereby dissolving the nitrogen into the molten mixture 24. Furthermore, boron is melted into the molten mixture 24 as described above (the boron melting process and the molten mixture forming process).

Crystal nuclei of the seed crystal 30 are formed on the inner wall of the reactor vessel 12 from source materials and boron which are melted in the molten mixture 24. The source materials and boron in the molten mixture 24 are supplied to these nuclei to grow the nuclei to the needle-like seed crystal 30. In the course of the crystal growth of the seed crystal 30, as described above, boron in the molten mixture 24 is taken into the seed crystal 30 (the boron taking process), so that the "boron-rich" third region 29a is likely to be formed at the inner side of the seed crystal 30, and the seed crystal 30 is likely to be elongated in the c-axis. As the boron density in the molten mixture 24 reduces, the amount of boron taken into the crystal reduces (the boron reducing process). Thus, the "boron-poor" fourth region 29b is likely to be formed at the outside of the third region 29a, and the seed crystal 30 is likely to grow toward m-axes while the growth toward the c-axis slows or reduces.

Preferably, the partial pressure of nitrogen in the pressure resistant vessel 11 is 5 MPa to 10 MPa.

Preferably, the temperature in the molten mixture 24 (the crystal growth temperature) is 800 degrees Celsius to 900 degrees Celsius.

In a preferable embodiment, a mol ratio of alkali metal to the total mol number of gallium and alkali metal (e.g. sodium) is 75% to 90%, the crystal growth temperature of the molten mixture 24 is 860 degrees Celsius to 900 degrees Celsius, and the partial pressure of nitrogen is 5 MPa to 8 MPa.

In a further preferable embodiment, the mol ratio of gallium to alkali metal is 0.25:0.75, the crystal growth temperature is 860 degrees Celsius to 870 degrees Celsius, and the partial pressure of nitrogen is 7 MPa to 8 MPa.

Via the above processes, the seed crystal of the first region 21A is obtained as the seed crystal 30 used for manufacturing the group 13 nitride crystal 19. Alternatively, the first region 21 is obtained through the first process which grows the third region 29a made of the GaN crystal containing boron, without using the second process.

[3] Manufacturing Method of Group 13 Nitride Crystal

The group 13 nitride crystal 19 as explained above is manufactured by using these seed crystals 30 as explained in [2] and enlarging the c-plane cross-sectional area of these seed crystals 30.

<Crystal Manufacturing Apparatus>

Figure 9:
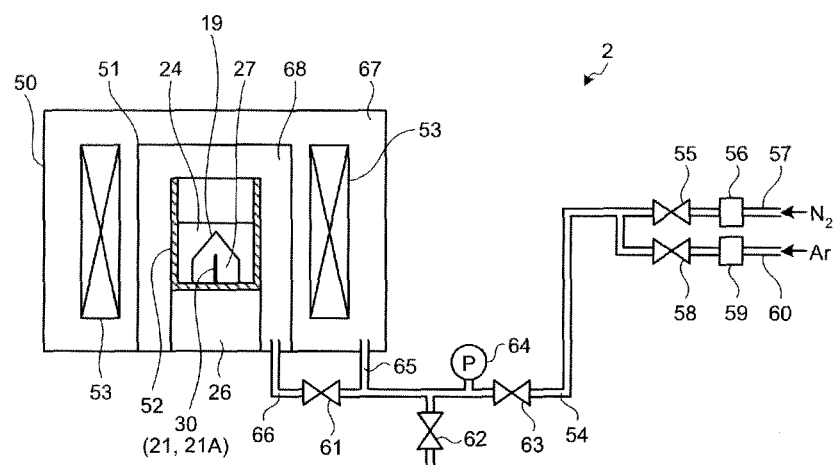
FIG. 9 is a schematic sectional view illustrating a crystal manufacturing apparatus to form a group 13 nitride crystal.

FIG. 9 schematically shows an exemplary structure of the crystal manufacturing apparatus 2 used for manufacturing the group 13 nitride crystal 19 through the crystal growth of the second region 27 from the seed crystal 30. The crystal manufacturing apparatus 2 is provided with an outside pressure resistant vessel 50 made of stainless material. An inner vessel 51 is disposed in the stainless outside vessel 50. A reactor vessel 52 is disposed in the inner vessel 51. Thus, the apparatus 2 has a double vessel structure. The inner vessel 51 is attachable to and detachable from the outside pressure resistant vessel 50. Hereinafter, an explanation will be made on a case that the seed crystal of the first region 21A is used as the seed crystal 30.

The reactor vessel 52 is a vessel for retaining the molten mixture 24 of alkali metal and material containing at least group 13 element, as well as the seed crystal 30, to grow the second region 27 from the seed crystal 30 (incidentally, to grow a bulk crystal from the seed crystal is called "Seed Growth" or abbreviated as SG).

The material of the reactor vessel 52 may be without limitation nitrides such as sintered BN, P-BN and the like, oxides such as alumina, YAG and the like, carbides such as SIC and the like. The inner wall of the reactor vessel 52, i.e. a part of the reactor vessel 52 contacting the molten mixture 24, is preferably made of a material insensitive or unreactive to the molten mixture 24. When the second region 27 is made of GaN crystal, a material which allows the crystal growth of GaN may be nitrides such as boron nitride (BN), pyrolytic BN (P-BN), aluminum nitride and the like, oxides such as alumina, yttrium-aluminum-garnet (YAP) and the like, stainless steel (SUS) and so on.

To the outer pressure resistant vessel 50 and the inner vessel 51, gas supplying pipes 65 and 66 are respectively connected to supply nitrogen (NA gas to be a source material of the group 13 nitride crystal 19 and diluent gas for controlling the whole pressure to the inner space 67 of the outer pressure resistant vessel 50 and the inner space 68 of the inner vessel 51. The gas supplying pipe 54 is split into the nitrogen supplying pipe 57 and the gas supplying pipe 60. These pipes can be separated at valves 55 and 58, respectively.

As the diluent gas, argon (Ar) gas which is an inert gas is preferably used. However, the embodiment is not limited to this. Other inert gas such as helium (He) may be used as the diluent gas.

The nitrogen gas is introduced from the nitrogen supplying pipe 57 connected to a gas canister or the like of nitrogen gas. The pressure of the nitrogen gas is controlled by the pressure regulator 56. Then, the nitrogen gas is supplied to the gas supplying pipe 54 via the valve 55. On the other hand, the gas for controlling the whole pressure (e.g. Ar gas) is introduced from the whole pressure controlling gas supplying pipe 60 connected to a gas canister or the like of the gas for controlling the whole pressure. The pressure of the gas for controlling the whole pressure is controlled by the pressure regulator 59. Then, the gas for controlling the whole pressure is supplied to the gas supplying pipe 54 via the valve 58. Thus, the pressure regulated nitrogen gas and the pressure regulated gas for controlling the whole pressure are supplied to the gas supplying pipe 54 and mixed.

The gas mixture of the nitrogen gas and the diluent gas is supplied to the outer pressure resistant vessel 50 and the inner vessel 51 via the gas supplying pipes 65 and 66 respectively through the gas supplying pipe 54. The inner vessel 51 can be detached from the crystal manufacturing apparatus 2 at the valve 61.

A pressure meter 64 is arranged on the gas supplying pipe 54 for controlling pressures in the outer pressure resistant vessel 50 and the inner vessel 51 while monitoring the whole pressure of the outer pressure resistant vessel 50 and the inner vessel 51.

In the embodiment, the partial pressure of nitrogen gas can be controlled by controlling the pressure of the nitrogen gas and the pressure of the diluent gas with the valves 55, 58 and the pressure regulators 56, 59. Furthermore, the whole pressure of the outer pressure resistant vessel 50 and the inner vessel 51 can be controlled. Thereby, it is possible to reduce or suppress the vaporization or evaporation of alkali metal (e.g. sodium) in the reactor vessel 52 by increasing the whole pressure in the inner vessel 51. In other words, it is possible to control independently or separately the partial the nitrogen gas as the nitrogen source which affects the crystal growth conditions of the gallium nitride, and the whole pressure which affects the evaporation suppression of sodium.

As shown in FIG. 9, a heater 53 is disposed around the outer circumference of the inner vessel 51 in the outer pressure resistant vessel 50 for heating the inner vessel 51 and the outer pressure resistant vessel 50, and thereby controlling the temperature of the molten mixture 24.

<Preparation of Source Materials or the like and Crystal Growth Conditions>

The operation for putting the source materials which may be the seed crystal 30 and other materials such as Ga and Na, and C as dopant into the reactor vessel 52 can be conducted in such a manner that the inner vessel 51 is put into a glove box under an inert gas atmosphere such as Ar gas. This operation may be conducted in a state that the reactor vessel 52 is put into the inner vessel 51.

In the reactor vessel 52, the seed crystal 30 as mentioned in [2] is placed. Also to the reactor vessel 52, a material (e.g. gallium) containing or including at least group 13 element and a material used as flux are putted.

As the material as flux, sodium or sodium compound (e.g. sodium azide) may be used, as well as other alkali metals such as lithium, potassium and so on, or compounds of these alkali metals. Furthermore, alkali earth metals such as barium, strontium, magnesium and so on, or compounds of these alkali earth metals may be used as flux. A plurality kinds of alkali metals or alkali earth metals may be used.

As the material containing or including the group 13 element as the source material, gallium which is a group 13 element may be used for example. Other group 13 elements such as boron, aluminum, indium and so on, or compounds of these elements may be used.

A mol ratio of the material containing or including the group 13 element to alkali metal is not limited to any particular one. However, the mol ratio of alkali metal to the total mol ratio of the alkali metal and the group 13 element is preferably 40% to 95%.

After the materials are set as mentioned above, the heater 53 is turned on to heat the inner vessel 51 and the reactor vessel 52 inside of the inner vessel 51 to a crystal growth temperature. Then, the source materials in the reactor vessel 52, which are the material containing or including group 13 element, alkali metal, and other additives, are melted in the reactor vessel 52 to form the molten mixture 24. By bring the nitrogen having the aforementioned partial pressure into contact with the molten mixture 24 and thereby dissolving the nitrogen into the molten mixture 24, the nitrogen which is a source material of the group 13 nitride crystal 19 can be supplied to the molten mixture 24 (the molten mixture forming process).

Source materials melted in the molten mixture 24 are supplied onto the outer circumference surface of the seed crystal 30, so that the second region 27 is grown from the outer circumference surface of the seed crystal 30 with the source materials (the crystal growth process).

Thus, the group 13 nitride crystal 19 including the seed crystal 30 can be manufactured due to the crystal growth of the second region 27 from the outer circumference of the seed crystal 30.

In a preferred embodiment, the partial pressure of nitrogen gas in the inner space 68 of the inner vessel 51 and the inner space 67 of the outer pressure resistant vessel 50 is preferably at least 0.1 MPa or more. In a more preferable embodiment, the partial pressure of nitrogen gas in the inner space 68 of the inner vessel 51 and the inner space 67 of the outer pressure resistant vessel 50 is preferably 2 MPa to 5 MPa.

In a preferable embodiment, the temperature (crystal growth temperature) of the molten mixture 24 is at least 700 degrees Celsius or more. In a more preferable embodiment, the crystal h temperature is preferably 850 degrees Celsius to 900 degrees Celsius.

Conditions of a single crystal growing process can be selected as appropriate depending on the target group 13 nitride crystal 19.

The seed crystal of the first region 21 and the seed crystal of the first region 21A, which can be obtained by the manufacturing method or process of the seed crystal 30, are crystals obtained by the growth mainly in the c-axis direction. On the other hand, the group 13 nitride crystal 19, which can be obtained by the crystal growth of the second region 27 from the seed crystal 30, is formed by the crystal growth mainly in directions perpendicular to the c-axis. Thus, the first region 21 or the 21A has a crystal growth direction different from that of the second region 27. If the crystal growth direction is different, the way of taking impurities is also different. Thereby, the ways of taking impurities are different between the first region 21 or 21A and the second region 27. Therefore, it is considered that the second region 27 obtained by the crystal growth in directions perpendicular to the c-axis according to the aforementioned method becomes an area of higher carrier density than the first region 21 or 21A obtained by the crystal growth in the c-axis direction.

Since the first region 21 or 21A is used as the seed crystal, the thickness of the second region 27 becomes bigger than the maximum diameter of the first region 21 or 21A in the c-plane cross section in the manufactured group 13 nitride crystal 19. Thus, the second region becomes a large area. Thereby, it is considered that, by using the second region 27, it is possible to provide a high quality group 13 nitride crystal 19 advantageously applicable to a low resistance conductive device or the like.

As the conductive device, there may be a semiconductor laser, an LED (light-emitting diode), and so on.

By using the aforementioned manufacturing method, the second region 27 obtained by the aforementioned crystal growth process includes segmented regions 25 and boundary regions 26 (see FIG. 3).

As mentioned above, the second region 27 is composed of a plurality of segmented regions or domains. Boundaries among the plurality of segmented regions or domains are the boundary regions or walls 26.

Impurities are more likely to be taken selectively by the boundary regions 26 than the segmented regions 25 adjacent to the corresponding boundary regions 26. Thereby, the segmented regions 25 and the boundary regions 26 satisfy the aforementioned relationship of the carrier densities.

The segmented regions 25 have less impurities than the boundary regions 26. In addition to that, the distribution of impurities is more even in the segmented regions 25 than the boundary regions 26. The boundary regions 26 of the second region 27 are just regions corresponding to boundary surfaces among segmented regions 25. Therefore, the segmented regions 25 occupy larger area than the boundary regions 26. Thereby, it is possible to obtain a high quality and large area of the second region 27.

In a case that the group 13 nitride crystal 19 is manufactured by growing the second region 27 from the seed crystal 30, the dislocation density of the second region 27 grown from the outer circumference surface composed of the m-planes of the seed crystal 30 is affected by the quality of the outer circumference surface of the seed crystal 30.

As mentioned in [2], in a case that the seed crystal of the first region 21A is used as the seed crystal 30, the outer circumference composed of the m-planes of the seed crystal 30 has a low dislocation density and a high quality. Thereby, by growing the second region 27 from the first region 21A as the seed crystal, it is possible to reduce the dislocation propagated to second region 27 from the seed crystal 30. Thereby, the dislocation density of the manufactured group 13 nitride crystal 19, specifically the dislocation density of the second region 27 can be suppressed to a low extent. Therefore, it is considered to easily manufacture the larger and higher quality group 13 nitride crystal 19.

In the crystal manufacturing method according to the embodiment, the seed crystal 30 and the second region 27 grown from the seed crystal 30 may be of the same material (e.g. gallium nitride). In this case, different from a case that a hetero material such as aluminum nitride (AlN) is used as the seed crystal, the lattice constant or the thermal expansion coefficient can be matched. Thereby, it is possible to reduce or suppress the occurrence of the dislocation due to the lattice mismatch or the difference of the thermal expansion coefficient.

The seed crystal 30 and the second region 27 are formed by the same crystal growth method (flux method). Thereby, it is possible to improve the matching of the lattice constant and the thermal expansion coefficient and thereby readily reduce or suppress the occurrence of the dislocation, in comparison with a case that the seed crystal 30 and the second region 27 are manufactured by the different method from each other.

Via the aforementioned process or method, the group 13 crystal 19 can be manufactured with a high quality and a practical or useful size.

The explanation has been made on the flux method as the crystal growth method. However, the crystal growth method is not limited to the flux method. Vapor phase growth method such as HVPE (Hydride Vapor Phase Epitaxy) or liquid phase methods other than the flux method may be used for crystal growth. From the viewpoint of obtaining the high quality group 13 nitride crystal 19, however, the flux method is preferably used. Specifically, it is possible to grow the higher quality second region 27 by using the flux method for forming the group 13 nitride crystal 19. Therefore, it is considered that the higher quality group 13 nitride crystal 19 can be obtained.

It is sufficient that a position of the first region 21 or 21A which is a region used as the seed crystal in the group 13 nitride crystal 19 manufactured by the manufacturing process of method as mentioned in [3] is inside of the group 13 nitride crystal 19. For example, the position of the first region 21 or 21A in the group 13 nitride crystal 19 may be located extending around the center of the c-plane cross section along the c-axis of the group 13 nitride crystal 19, or may be located a position deviated from such a position extending around the center of the c-plane cross section along the c-axis of the group 13 nitride crystal 19.

In the embodiment, the explanation has been made on a needle-like crystal in which a six-sided pyramid is placed on a hexagonal column-like crystal having an upper base surface which becomes a bottom surface of the six-sided pyramid. However, the crystal is not limited to this. For example, the crystal may have a shape of six-sided pyramid without any m-planes.

<Dislocation Density>

Figure 10:
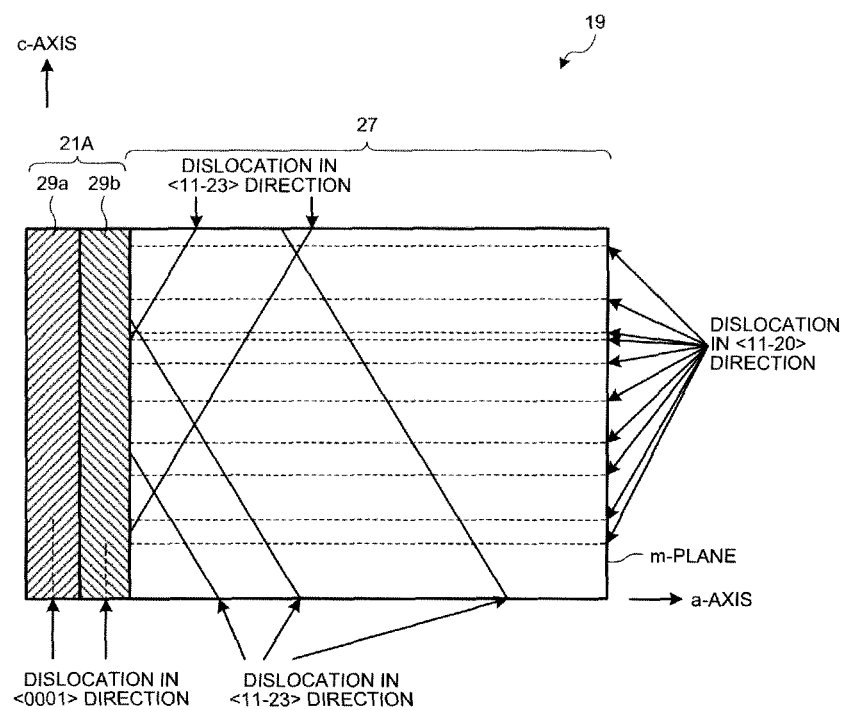
FIG. 10 is a schematic sectional view illustrating dislocations in a cross section parallel to the c-axis and the a-axis of a group 13 nitride crystal.

Next, an explanation will be made on the dislocation in the crystal with an example. FIG. 10 schematically shows the dislocation in a cross section parallel to the t-axis and the a-axis in the group 13 nitride crystal 19. In FIG. 10, a right side part with respect to the first region 21A in the cross section parallel to the c-axis and the a-axis in the group 13 nitride crystal 19 is enlarged.

In any case, whether the crystal is grown by the flux method or the HVPE, the dislocation generally occurs in the group 13 nitride crystal 19 more than a little. If there is any dislocation (line defect, point defect) on the outer circumference of the first region 21 or 21A, the dislocation may be propagated to the second region 27 when the second region 27 is grown from the outer circumference surface of the first region as the seed crystal. It is considered that the occurrence of the dislocation is be caused by the difference of the thermal expansion coefficient and the difference of the lattice constant between the seed crystal and the second region 27 grown therefrom, or is caused by any defect such as crack or any crystal strain on the surface of the seed crystal.

On the contrary, in the embodiment, the second region 27 is grown from the first region 21A as the seed crystal, that is, from the fourth region 29b. Therefore, the dislocation density in the second region 27 of the group 13 nitride crystal 19 can be readily reduced.

Generally, the dislocation (line defect) extending parallel to the crystal growth direction continues to extend without disappearance while the crystal is grown. On the other hand, the line defect extending in a direction unparallel to the crystal growth direction often disappears during the crystal growth. In other words, it grows toward the m-axis directions (i.e. directions in which the c-plane cross section of the hexagon enlarges) from the m-planes which correspond to the outer circumference surface composed of the m-planes of the seed crystal 30. Therefore, many of the dislocations arisen from the growth interface of the seed crystal are oriented to <11-20> direction parallel to the crystal growth direction, and few or a few of the dislocations is oriented to <11-23> direction unparallel to the crystal growth direction.

There are <0001> direction and <11-23> direction as the dislocation direction intersecting the c-plane of the group 13 nitride crystal 19 having a hexagonal crystal structure. In the embodiment, the dislocation in the <0001> direction does not occur, and the dislocation in the <11-23> direction is few or a few.

Therefore, in a preferable embodiment, the dislocation density of the second region 27 of the group 13 nitride crystal 19 in the c-plane is smaller than that of the region inner than the second region 27.

[4] Group 13 Nitride Crystal Substrate

The group 13 nitride crystal substrate according to the embodiment can be obtained by processing the group 13 nitride crystal 19.

By changing the process direction (cutting direction) of the group 13 nitride crystal 19, it is possible to various group 13 nitride crystal substrates each having a main face which may be any selected crystal face or plane including for example the c-plane, the m-plane, the a-plane, {10-11} plane, {11-23} plane and so on.

The process shape of the group 13 nitride crystal 19 is not limited to any particular shape. However, it is preferable to process the crystal 19 so that a substrate is made from one segmented region 25 and without including any boundary region 26 in the second region 27.

As mentioned above, the segmented regions 25 are regions which are of higher quality and more uniform or even than the boundary regions 26. Thereby, it is possible to obtain the high quality group 13 nitride crystal substrate having a large area and uniform or even property by processing the group 13 nitride crystal 19 so as to make the group 13 nitride crystal substrate from one segmented region 25 without including any boundary region 26. Such a group 13 nitride substrate is considered to be applicable to more precise electronic device, optical device, and so on.

Even in a case that the group 13 nitride crystal is cut or processed so as to make the group 13 nitride crystal substrate from a plurality of segmented regions 25 and with including at least one boundary region 26, it is possible to obtain the group 13 nitride crystal substrate applicable to more precise electronic device, optical device and so on, in comparison with the prior arts, since the carrier density is uniform among the plurality of segmented regions 25.

Figure 11:
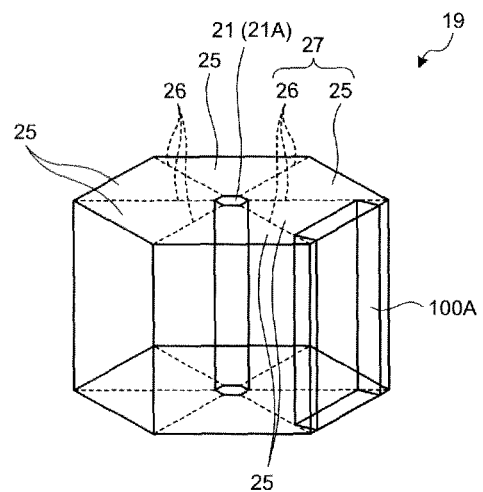
FIG. 11 is a schematic view illustrating a group 13 nitride crystal substrate processed from a group 13 nitride crystal.

FIG. 11 shows a group 13 nitride crystal substrate 100A as an example. As shown in FIG. 11, the substrate 100A obtained by cutting or processing the group 13 nitride crystal 19 is one example of a crystal substrate (m-plane substrate) which has a m-plane as main face and which is made from one segmented region 25 of the second region 27 without including any boundary region 26.

The m-plane of the group 13 nitride crystal substrate 100A which is a m-plane substrate having a m-plane as main face as shown in FIG. 11 is a non-polar surface. Thereby, the group 13 nitride crystal substrate 100A which is a m-plane substrate is applicable to high performance devices which arise no piezoelectric polarization.

Figure 12:
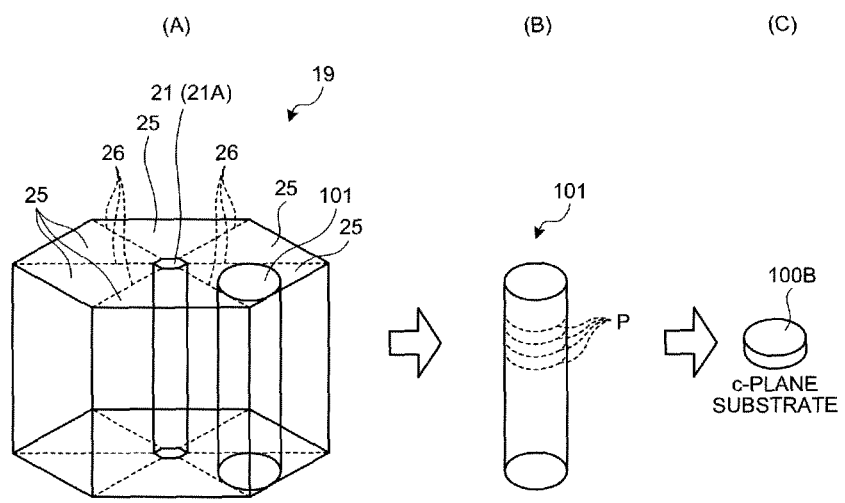
FIG. 12 is a schematic view illustrating a group 13 nitride crystal substrate processed from a group 13 nitride crystal, (A) showing a group 13 nitride crystal, (B) showing a cylinder-like crystal cutout from (A) state, and (C) showing a group 13 nitride crystal substrate sliced from (B) state.

FIG. 12 shows another processing method, which is different from FIG. 11, of the group 13 nitride crystal 19. As shown in FIG. 12(A), a cylinder-like body elongated in the c-axis is cut out from a region corresponding to one segmented region 25 of the second region 27 of the group 13 nitride crystal 19. Thereby, the cylinder-like group 13 nitride crystal 101 is obtained as shown in FIG. 12(B). Then, the cylinder-like group 13 nitride crystal 101 is cut along a direction orthogonal to the c-axis (dotted lines P in FIG. 12(B)). Thus, the group 13 nitride crystal substrate 100B (c-plane substrate) is obtained from the one segmented region 25 of the second region 27 without including any boundary region 26 and having the c-plane as main face, as shown in FIG. 12(C).

[5] Preferable Shape of Group 13 Nitride Crystal (Bulk Crystal)

Figure 13:
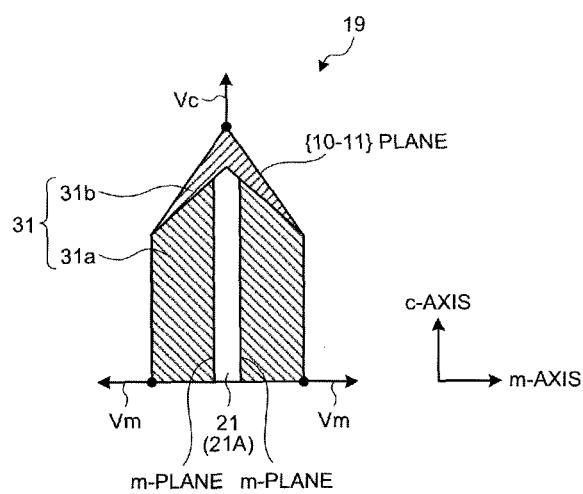
FIG. 13 is a schematic view illustrating a process of growing a group 13 nitride crystal from a seed crystal.
Figure 14:
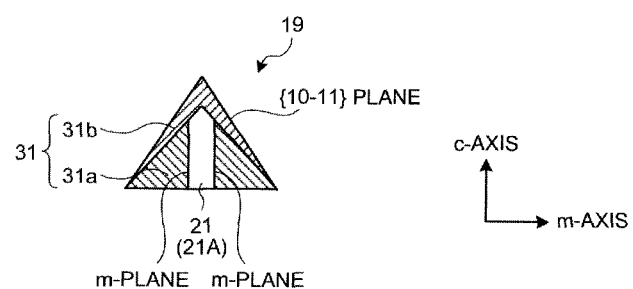
FIG. 14 is schematic view illustrating a process of growing a group 13 nitride crystal from a seed crystal.
Figure 15:
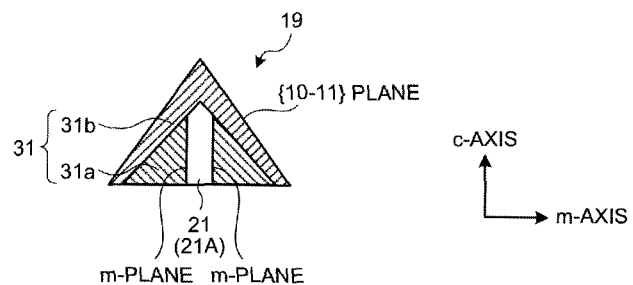
FIG. 15 is a schematic view illustrating a process of growing a group 13 nitride crystal from a seed crystal.

Next, an explanation will be made on a preferable shape of the group 13 nitride crystal 19. FIG. 13 to FIG. 15 schematically show a process to grow the second region 27 from the seed crystal made of the first region 21A (including the third region 29a and the fourth region 29b) or 21. In the explanation herein, the crystal growth method is not limited to any particular one. FIG. 13 to FIG. 15 show a cross section parallel to the c-axis and the a-axis of the group 13 nitride crystal 19.

As shown in FIG. 13, the group 13 nitride crystal 19 is considered to include a region 31a and a region 31b. The region 31a is grown mainly from the m-plane which is the outer circumference surface of the first region 21 or 21A as the seed crystal toward the m-axis directions (i.e. directions in which the c-plane cross section of the hexagon enlarges). The region 31b is grown mainly from) {10-11} plane of the seed crystal or {10-11} plane on the region 31a.

In the region 31b, a rate or speed of forming the {10-11} plane is considered to be a rate-controlling speed. Therefore, it is considered that the group 13 nitride crystal (the second region 27) which grows around the upper part of the seed crystal is likely to be a six-sided pyramid-like shape.

FIG. 14 schematically shows a crystal growth in a case that a length L in the c-axis direction of the seed crystal is short. In a case that the length L of the seed crystal is not long enough, a ratio of the six-sided pyramid-like part to the hexagonal column-like part is great. Thereby, a volume ratio of the region 31b grown to the <10-11> direction to the region 31a grown to the m-axis direction becomes great. Therefore, the group 13 nitride crystal 19 is likely to be a shape as illustrated in FIG. 14. In this case, all the c-plane cross sections includes the region 31b.

FIG. 15 schematically shows a further proceeded status of the crystal growth of the group 13 nitride crystal (the second region 27) of FIG. 14. As shown in FIG. 15, it is often observed that once the outer circumference of the seed crystal is surrounded by the region 31b, the outer circumference surface made of the m-plane is not formed even if the crystal growth is continued, and the group 13 nitride crystal (the second region 27) is grown with keeping the {10-11} plane as the outer circumference surface.

The region 31a is a region which starts the crystal growth from the outer circumference surface of the m-plane of the seed crystal. As mentioned above, the group 13 nitride crystal (the region 31a) mainly grown from the m-plane of the seed crystal is considered to have relatively less threading dislocation in the c-axis direction. Therefore, much region 31a is preferably contained, in a case that the group 13 nitride crystal substrate having the c-plane as main face is fabricated.

[6] Preferable Size of Seed Crystal

Next, an explanation will be made on a preferable shape of the seed crystal to grow the group 13 nitride crystal 19 having the aforementioned preferable shape. The first region 21A as the seed crystal has a hexagonal crystal structure in which an angle formed between the c-plane and the a+c-axis (<11-23> direction) may be for example 58.4 degrees. In a case that the ratio L/d of the length L in the c-axis direction of the first region 21A as the seed crystal to the crystal diameter "d" in the c-plane cross section is 0.813 for example, the seed crystal becomes a six-sided pyramid-like shape.

As mentioned above, in order to obtain the high quality group 13 nitride crystal 19, the group 13 nitride crystal (the second region 27) is preferably grown from the m-plane outer circumference surface of the seed crystal. In a preferable embodiment, the seed crystal preferably includes the m-plane as the outer circumference surface.

Figure 16:
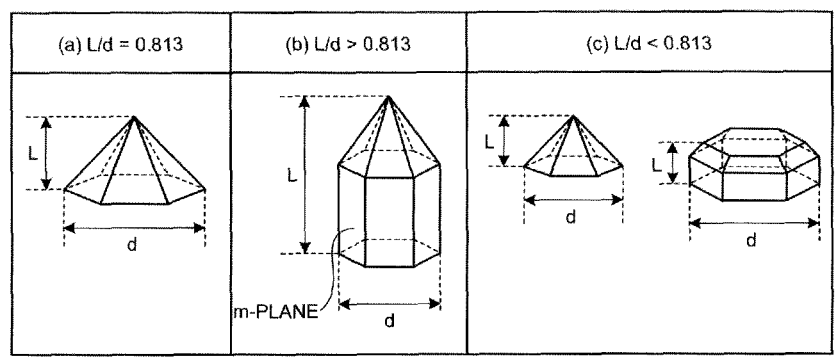
FIG. 16 is a schematic view illustrating various relationships between a seed crystal shape and L/d.

FIG. 16 schematically shows various relationship between the first region 21A seed crystal shape and the ratio L/d. As shown in FIG. 16, when the ratio L/d=0.813, the seed crystal is a six-sided pyramid-like shape. When the ratio L/d>0.813, the upper part is a six-sided pyramid-like shape and the lower part is hexagonal column-like shape. In this case, the outer circumference surface (side surfaces) of the seed crystal includes the m-plane. When the ratio L/d<0.813, the seed crystal is a six-sided pyramid-like shape without including the m-plane, or a shape having a truncated six-sided pyramid-like part without a top part of the pyramid and a low profile hexagonal column-like part including the m-plane.

Therefore, in a preferable embodiment, the ratio L/d is preferably greater than 0.813.

The practical size of the group 13 nitride crystal substrate (100A, 100B) is desired to be half-inch (12.7 mm) or 2 inches (5.08 cm). In the following explanation, the explanation will be made on the size of the seed crystal required in a case that group 13 nitride crystal substrate 100S having the c-plane as main face has the maximum diameter of half-inch (12.7 mm) or more, or the maximum diameter of 2 inches or more.

In the following explanation, as an example of the minimum thickness required for the practical substrate, a case that the thickness of the group 13 nitride crystal substrate 100B is 1 mm is simulated. However, the required minimum thickness is not limited to this, and can be simulated as appropriate.

In order for the diameter of the group 13 nitride crystal substrate 100B to be 12.7 mm, that is, for the diameter "d" of the group 13 nitride crystal substrate 100B to be 12.7 mm, the second region 27 is required to be grown to a radius direction (the m-axis direction) by at least 6.35 mm or more, if the diameter of the seed crystal is neglected as zero.

As an example, if the crystal growth rate Vm in the m-axis direction is assumed to be twice of the crystal growth rate Vc in the c-axis direction, the crystal is grown about 3.2 mm in the c-axis direction while grown 6.35 mm in the m-axis direction. As mentioned above, the ratio L/d is greater than 0.813 (L/d>0.813). Therefore, in order for the crystal diameter "d" (the diameter of the bottom surface of the hexagonal column-like part) to be 12.7 mm, the length L in the c-axis direction (the height of the six-sided pyramid-like part) is 11.9 mm. Therefore, the required length of the seed crystal 27 is calculated as "11.9−3.2=8.7" mm. That is, the minimum length of the seed crystal 27 required for obtaining the group 13 nitride crystal 80 having the six-sided pyramid-like shape is 8.7 mm. It is desired that a hexagonal column-liked region is formed under the six-sided pyramid-like part. If the required thickness of the group 13 nitride crystal substrate 100B is assumed as 1 mm or more, the required length L in the c-axis direction of the seed crystal 27 is estimated as 9.7 mm.

Thus, in a preferable embodiment, the length L in the c-axis direction of the seed crystal (the first region 21 or the first region 21A) is preferably 9.7 mm or more.

In a preferable embodiment, as for the seed crystal, the ratio L/d (the ratio of the length L in the c-axis direction to the diameter d in the c-plane) is preferably greater than 0.813, and the length L is preferably 9.7 mm or more. More preferably, L/d is greater than 7, and still more preferably, L/d is greater than 20.

As described above, according to the preferable embodiment, it is possible to fabricate the group 13 nitride crystal substrate 100B having the diameter of the c-plane that is half-inch. As mentioned above, since the group 13 nitride crystal 19 grown from the m-plane of the seed crystal is of high quality, a large and high quality group 13 nitride crystal substrate 100B can be fabricated.

In order to obtain the group 13 nitride crystal substrate 100B having the diameter of 2 inches (5.08 cm), the required length L in the c-axis direction of the seed crystal is estimated as 37.4 mm or more.

Therefore, in a preferable embodiment, the length L in the c-axis direction of the seed crystal is preferably 37.4 mm or more. Thereby, it is possible to fabricate the group 13 nitride crystal substrate 100B having the diameter in the c-plane that is 2 inches or more. As mentioned above, since the group 13 nitride crystal 19 grown from the m-plane of the seed crystal is of high quality, a large diameter and high quality group 13 nitride crystal substrate 100B can be fabricated.

EXAMPLES

Examples will be shown below for further understanding the invention. However, the invention is not limited to these examples. The reference numerals in the following explanation correspond to the construction or configuration of the crystal manufacturing apparatus 1,2 explained with reference to FIG. 8 and FIG. 9.

—Manufacture of Seed Crystal—

A seed crystal used for manufacturing the group 13 nitride crystal was formed according to the following procedure.

<Example 1 of Manufacturing Seed Crystal>

By using the crystal manufacturing apparatus 1 as illustrated in FIG. 8, a seed crystal of the first region 21A was formed.

Into the reactor vessel 12 made of a sintered BN having the inner diameter of 92 mm, gallium having the nominal purity of 99.99999% and sodium having the nominal purity of 99.95% are input with a mol ratio as 0.25:0.75.

In a glove box, the reactor vessel 12 was placed into the pressure resistant vessel 11 under a high purity Ar gas atmosphere. The valve 31 was closed to shut out the inner space of the reactor vessel 12 from the outer atmosphere, so that the pressure resistant vessel 11 was sealed under the state filled with Ar gas.

Then, the pressure resistant vessel 11 was taken out from the glove box and then assembled into the crystal manufacturing apparatus 1. Specifically, the pressure resistant vessel 11 was installed at a predetermined position with respect to the heater 13 and connected to the gas supplying pipe 14 of nitrogen gas and argon gas at the valve 31 portion.

Next, after argon gas was purged from the inner vessel 11, the nitrogen gas was introduced from the nitrogen supplying pipe 17. The nitrogen gas was subjected to the pressure control by the pressure regulator 16, and the valve 15 was opened, so that the nitrogen pressure in the inner vessel 11 was 3.2 MPa. Then, the valve 15 was closed and the pressure regulator 16 was set at 8 MPa. Then, the heater 13 was turned on to heat the reactor vessel 12 to a crystal growth temperature. In Example 1, the crystal growth temperature was 870 degrees Celsius.

At the crystal growth temperature, gallium and sodium in the reactor vessel 12 were melted to form a molten mixture 24. The temperature of the molten mixture 24 was the same as the temperature of the reactor vessel 12. Until heated to this temperature, in the crystal manufacturing apparatus 1 of Example 1, gas in the inner vessel 11 was heated so that the whole pressure was 8 MPa.

Next, the valve 15 is opened so that the pressure of nitrogen gas was 8 MPa, and the pressure equilibrium state was established between the inside of the inner vessel 11 and the inside of the nitrogen supplying pipe 17.

After a crystal of gallium nitride was grown while maintaining the reactor vessel 12 for 500 hours under this state, the heater 13 was controlled to cool the inner vessel 11 to a room temperature (around 20 degrees Celsius). After decreasing the gas pressure in the inner vessel 11, the inner vessel 11 was opened. In the reactor vessel 12, many gallium nitride crystals 25 were formed. A seed crystal 30 which was a grown gallium nitride crystal was colorless and transparent, had the crystal diameter "d" of about 100 to 1500 μm, had the length L of about 10 to 40 mm, and had the ratio L/d of the length L to the crystal diameter d was about 20 to 300. The seed crystal 30 which was a grown gallium nitride crystal was grown generally parallel to the c-axis, and had the m-planes formed on the side surfaces.

<Example 2 of Manufacturing Seed Crystal>

A crystal was formed similarly to Example 1 except that the material of the reactor vessel 12 was changed to alumina, a sintered BN plate of a just fit size was fit into a bottom of the reactor vessel 12, the nitrogen pressure in the pressure resistant vessel 11 was maintained at 6 MPa at the crystal growth temperature 870 degrees Celsius (the nitrogen pressure in the pressure resistant vessel 11 at a room temperature was 2.8 MPa), and the crystal growth time was 300 hours.

As a result, similarly to Example 1 of manufacturing the seed crystal, many seed crystals 30 were formed which were colorless and transparent grown gallium nitride crystals. The crystal diameter "d" was about 100 to 500 μm, the length L was about 10 to 15 mm, and the ratio L/d of the length L to the crystal diameter d was about 30 to 500.

Each seed crystal 30 manufactured in Example 1 and Example 2 was subject to various measurements. The measurement results were shown below.

<Photoluminescence (PL) Measurement Result>

Photoluminescence (PL) was measured at a room temperature (25 degrees Celsius) with respect to the seed crystal of Example 1 and the seed crystal of Example 2. Photoluminescence was measured by using LabRAM HR-80 fabricated by HORIBA, Ltd. As an exciting light source, helium—cadmium (He—Cd) laser having a wavelength of 325 nm was used. Photoluminescence was measured with respect to the first region 25a which was an inner region of the seed crystal 30 and with respect to the fourth region 25b which was an outer region of the seed crystal 30, respectively.

FIG. 7 shows one example of measurement result of emission spectra of PL with respect to the third region 29a and the fourth region 29b. The horizontal axis means wavelength (nm), and the vertical axis means emission intensity.

As shown by a solid line in FIG. 7, as for the third region 29a of the seed crystal of Example 1 and Example 2, a broad emission (the second peak) having a peak around 600 nm was observed in a range of 500 nm to 800 nm, while only a very weak intensity of emission was observed for an emission (the first peak) from a vicinity of band edge (364 nm) of gallium nitride.

On the other hand, as shown by a dotted line in FIG. 7, as for the fourth region 29b of the seed crystal of Example 1 and Example 2, a strong peak intensity of emission (the first peak) from the vicinity of band edge (364 nm) of gallium nitride was observed, while only a very weak intensity of emission was observed for a broad emission (the second peak) in a range of 500 nm to 800 nm.

Thus, with respect to the seed crystal 30 manufactured by Example 1 and Example 2, it was confirmed that the peak intensity of the first peak was smaller than the peak intensity of the second peak in the third region 29a contained at inner side of the seed crystal 30. It was also confirmed that the peak intensity of the first peak was greater than the peak intensity of the second peak in the fourth region 29b located at outer side of the seed crystal 30.

Figure 17:
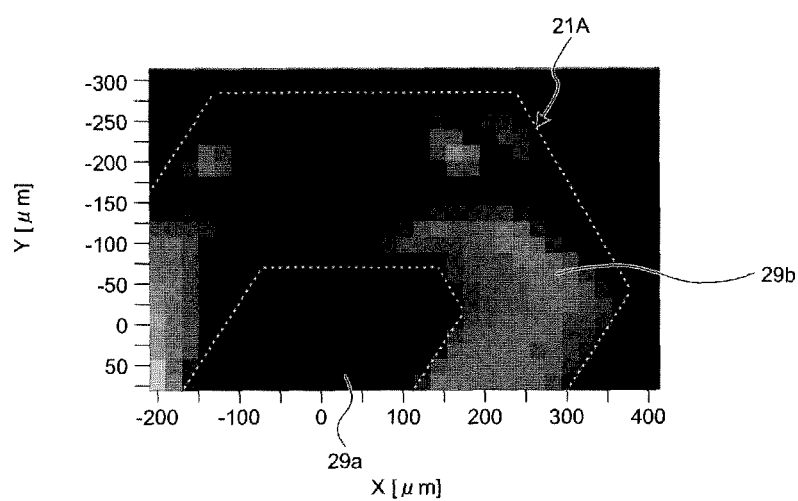
FIG. 17 is a mapping image of photoluminescence with respect to a spectral intensity of 360 nm to 370 nm.
Figure 18:
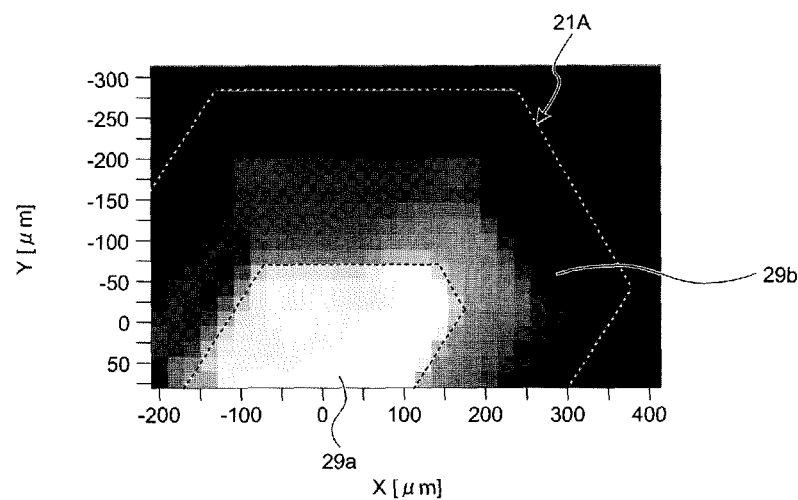
FIG. 18 is a mapping image of photoluminescence with respect to a spectral intensity of 500 nm to 800 nm.

Next, with reference to FIG. 17 and FIG. 18, an explanation will be made on emission intensity distributions of photoluminescence measured about the seed crystal 30 manufactured by Example 1 and Example 2. FIG. 17 and FIG. 18 show one example of photoluminescence measurement result which was measured as for the c-plane of the seed crystal 30 manufactured by Example 1 and Example 2, showing spectral intensity with different wavelength band at the same measurement point on the c-plane cross section.

FIG. 17 shows a mapping image of the spectral intensity in a range of 360 nm to 370 nm of photoluminescence. Darker color has stronger spectral intensity in a range of 360 nm to 370 nm.

FIG. 18 shows a mapping image of the spectral intensity in a range of 500 nm to 800 nm of photoluminescence. Darker color has stronger spectral intensity in a range of 500 nm to 800 nm.

Therefore, according to the mapping result of FIG. 17 and FIG. 18, it was confirmed that the seed crystal 3C manufactured by Example 1 and Example 2 had the third region 29a at inner side thereof and the fourth region 29h at outer side thereof.

Also, as a result of PL measurement as for the c-plane cross section of the seed crystal 30 manufactured by Example 1 and Example 2, it was confirmed that the fourth region 29b surrounds a whole outer periphery of the third region 29a in some seed crystals 30. In other seed crystals 30, it was confirmed that the fourth region 29b surrounds a part of the outer periphery of the third region 29a. Thus, it was confirmed that the fourth region 29b surrounds at least a part of the outer periphery of the third region 29a, in the c-plane cross section of the seed crystal 30 manufactured by Example 1 and Example 2.

<Boron Density Measurement>

Boron density in the crystal was measured by using a secondary ion mass spectrometer (SIMS) with respect to the seed crystal 30 manufactured by Example 1 and Example 2. As SIMS, INS 7f (model name) fabricated by CAMECA was used. As primary ion beam, $Cs^+$ ion was used. In this measurement, the boron density was measured at a plurality of points with respect to the inner region (i.e. the third region 29a) and with respect to the outer region (i.e. the fourth region 29b) in the c-plane cross section of the seed crystal 30, respectively.

Although there were some variations depending on the measurement points, the boron density in the third region 29a was approximately $5 \times 10^{18}$ $cm^{-3}$ to $3 \times 10^{19}$ $cm^{-3}$, and the boron density in the fourth region 29b was approximately $1 \times 10^{16}$ $cm^{-3}$ to $8 \times 10^{17}$ $cm^{-3}$.

Thus, with respect to the seed crystal 30 manufactured by Example 1 and Example 2, it was confirmed that the boron density in the fourth region 29b at outer side was lower than that of the third region 29a at inner side in the c-plane cross section.

Next, group 13 nitride crystals 19 were formed by using the seed crystals 30 manufactured by Example 1 and Example 2 according to the aforementioned crystal manufacturing method.

Example A1

In this Example, a group 13 nitride crystals 19 was formed by growing the second region 27 from, the seed crystal 30 by the crystal manufacturing apparatus 2 as illustrated in FIG. 9.

As the seed crystal 30, the seed crystal 30 manufactured by Example 1 was used. The seed crystal 30 had a width of 1 mm and a length of 40 mm. In this Example, there was used the seed crystal 30 in which the fourth region 29b surrounds a whole outer periphery of the third region 29a in at least a part of the c-plane cross sections. In the c-plane cross section of the seed crystal 30, it was confirmed that the thickness "t" (the thickness in the m-axis direction) of the fourth region 29b was at least 10 μm or more.

Firstly, the inner vessel 51 was separated from the crystal manufacturing apparatus 2 at the valve 61 portion, and placed into the glove box under Ar atmosphere. Next, the seed crystal 30 is placed in the reactor vessel 52 made of alumina and having an inner diameter of 140 mm and a depth of 100 mm. The seed crystal 30 was retained by inserting the crystal 30 into a hole having a depth of 4 mm made at the bottom of the reactor vessel 52.

Next, sodium (Na) was heated to be liquid and then put into the reactor vessel 52. After the sodium became solidified, gallium was input. In this Example, a mol ratio of gallium to sodium was 0.25:0.75.

Then, in the glove box, the reactor vessel 52 was placed into the inner vessel 51 under a high purity Ar gas atmosphere. Then, the valve 61 was closed to seal the inner vessel 51 filled with Ar gas, and shut out the inner space of the reactor vessel 52 from the outside atmosphere. Next, the inner vessel 51 was taken out from the glove box and then assembled into the crystal manufacturing apparatus 2. Specifically, the inner vessel 51 was installed at a predetermined place with respect to the heater 53, and connected to the gas supplying pipe 54 at the valve 61 portion.

Next, after argon gas was purged from the inner vessel 51, nitrogen gas was introduced from the nitrogen supplying pipe 57. The nitrogen gas was subjected to the pressure control by the pressure regulator 56, and the valve 55 was opened, so that the nitrogen pressure in the inner vessel 51 was 1.2 MPa. Then, the valve 55 was closed and the pressure regulator 56 was set at 3.2 MPa.

Next, the heater 53 was turned on to heat the reactor vessel 52 to a crystal growth temperature. In this Example, the crystal growth temperature was 870 degrees Celsius. Then, similarly to Example 1, the valve 55 was opened so that the nitrogen gas pressure became 3.2 MPa. Gallium nitride crystal was formed by maintaining the reactor vessel 52 for 1300 hours under this state.

As a result, in the reactor vessel 52, a group 13 nitride crystal 19 (single crystal) having a larger crystal diameter increased in a direction orthogonal to the c-axis was formed from the seed crystal 30. The group 13 nitride crystal 19 obtained by the crystal growth was generally colorless and transparent, and had the crystal diameter "d" of 51 mm, the length L in the c-axis direction of 54 mm including the seed crystal part which were inserted into the hole at the bottom of the reactor vessel 52. The group 13 nitride crystal 19 had a shape in which the upper part was a six-sided pyramid-like shape and the lower part was a hexagonal column-like shape.

Example A2

A group 13 nitride crystal 19 was formed similarly to Example A1 (same conditions, same manufacturing apparatus) except that the seed crystal 30 manufactured by Example 2 was used as the seed crystal.

The group 13 nitride crystal 19 obtained in this Example A2 had a shape in which the upper part was a six-sided pyramid-like shape and the lower part was a hexagonal column-like shape, similarly to the crystal 19 of Example A1.

Comparative Example A1

A crystal was formed similarly to Example A1 except that a sintered BN was used as the reactor vessel, the crystal growth temperature was 870 degrees Celsius, the nitrogen pressure was 10 MPa, and the crystal growth time was 300 hours. As a result, a needle-like crystal was obtained with the crystal diameter "d" of approximately 100 to 800 μm, and the length L of approximately 3 to 18 mm. However, the appearance of the crystal was of skeleton crystal, and the color was slightly yellowish and the transparency was low in comparison with the crystal of Example A1.

—Evaluation—
<Carrier Density Evaluation>

The carrier density was measured with respect to each of the group 13 nitride crystals 19 manufactured by Example A1, Example A2, and Comparative Example A1 at the c-plane cross section, respectively.

The carrier density was obtained by a method to convert the carrier density from Raman spectroscopy. The conversion was conducted according to "Characterization of GaN and Related Nitrides by Raman Scattering" (Hiroshi HARIMA, Journal of the Spectroscopical Society of Japan, Vol. 49, No. 5 (2000)). As the measurement apparatus, a laser Raman spectrometer (model name: LabRAM HR 800) fabricated by HORIBA, Ltd was used.

Figure 19:
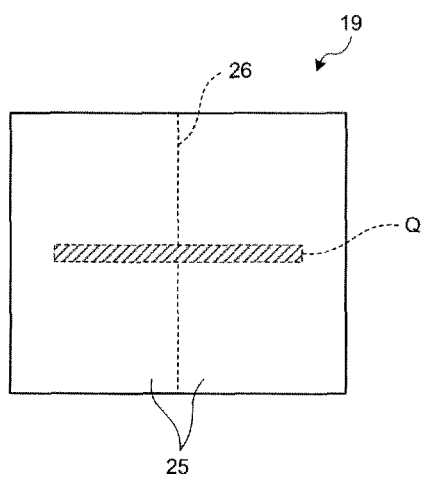
FIG. 19 is a schematic view illustrating an example of measurement target area of the carrier density.

The carrier density of the first region 21A which corresponds to the seed crystal part was measured at the c-plane cross section of the group 13 nitride crystal 19 manufactured by Example A1. The result was approximately $3 \times 10^{17}$ cm$^{-3}$ (within ±30%, the same in the following description). The carrier density within the segmented region 25 of the second region 27 of the group 13 nitride crystal 19 was measured as approximately $1 \times 10^{19}$ cm$^{-3}$. The carrier density of the boundary region 26 continuous to the measured segmented region 25 of the second region 27 of the group 13 nitride crystal 19 was measured as approximately $3 \times 10^{19}$ cm$^{-3}$. As shown in FIG. 19, the carrier density measurement was conducted for the boundary region 26 and the segmented regions 25 continuous to the boundary region 26 (i.e. within the region Q) in the second region 27. The carrier density was measured with respect to a plurality of segmented regions in the same group 13 nitride crystal substrate. The result was approximately $1 \times 10^{19}$ cm$^{-3}$.

Figure 20:
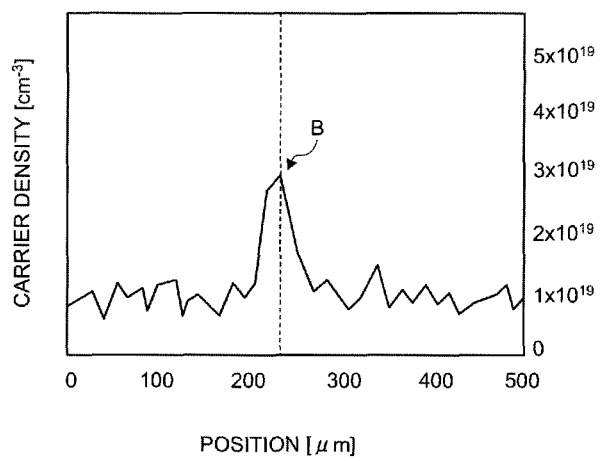
FIG. 20 is a graph illustrating a distribution of the carrier density in Example.

As shown in FIG. 20, it was observed that the carrier density of the boundary region 26 (see an arrow B in FIG. 20) was higher than that of the segmented regions 25 continuous the boundary region 26, when the carrier density was measured in a region extending over the boundary region 26 located at a boundary between the adjacent segmented regions 25.

Similarly, the carrier density of the second region 27 was measured also at a cross section parallel to the c-axis and the a-axis of the group 13 nitride crystal. Similarly to FIG. 20, it was observed that the carrier density of the boundary region 26 (see an arrow B in FIG. 20) was higher than that of the segmented regions 25 continuous to the boundary region 26.

Similarly, the carrier density was measured also for the group 13 nitride crystal 19 manufactured by Example A2. The similar result as the group 13 nitride crystal 19 of Example A1 was obtained.

On the other hand, the carrier density was measured also for the group 13 nitride crystal manufactured by Comparative Example A1 at the c-plane cross section. The result was $3 \times 10^{19}$ cm$^{-3}$. It can be estimated from the skeleton crystal appearance and the yellowish color that the crystal manufactured by Comparative Example A1 contains dot defects or impurities such as oxygen. This is considered as a reason of the high carrier density.

Next, group 13 nitride crystal substrates were fabricated by using the group 13 nitride crystals manufactured by Example A and Comparative Example A.

Example B1

Example of C-Face Substrate

A group 13 nitride crystal substrate containing the first region 21 and the second region 27 (including the segmented regions 25 and the boundary region 26) and having an outer diameter (φ) of 2 inches, a thickness of 400 μm, and the c-plane as main face was fabricated by grinding the outline of the group 13 nitride crystal manufactured by Example A1, slicing the grinded crystal parallel to the c-plane, polishing the sliced crystal, and treating surface(s) of the polished crystal.

The carrier density was measured with respect to the first region 21, the segmented regions 25 of the second region 27, and the boundary region 26 of the second region 27 of the obtained substrate. The same result as Example A1 was obtained.

The outermost surface of each GaN crystal substrate was etched to appear etch pits by dipping the main face (c-plane) of the substrate into a molten mixture of 420 degrees Celsius obtained by mixing molten KOH and molten NaOH (molten KOH mass:molten NaOH mass=50:50). A micrograph of composition of a cross section parallel to the c-axis and the a-axis after etching was obtained by using an electron microscope. The etch pit density (EPD) was calculated from the obtained micrograph.

As a result, the dislocation density of the seed crystal (the first region 21) was in the order of $10^6$ cm$^{-2}$ the dislocation density of the segmented regions 25 of the second region was in the order of $10^2$ cm$^{-2}$. It was confirmed that the group 13 nitride crystal can be obtained with higher quality with much less dislocation density, in comparison with group 13 nitride crystals formed from aluminum nitride needle-like crystal as the seed crystal according to the conventional crystal manufacturing method.

Example B2

A group 13 nitride crystal substrate containing the first region 21 and the second region 27 (including the segmented regions 25 and the boundary region 26) and having a thickness of 400 μm, and the c-plane as main face by grinding the outline of the group 13 nitride crystal manufactured by Example A1, cutting the crystal into a cylinder-like shape from one of segmented regions 25 of the second region 27, and slicing the cylinder-like shaped crystal parallel to the c-plane.

The carrier density was measured with respect to the obtained substrate, similarly to Example A1. The same result as the segmented regions 25 part measured in Example 81 was obtained.

The dislocation density was measured similarly to Example A1. As a result, the dislocation density was in the order of $10^2$ cm$^{-2}$. It was confirmed that the group 13 nitride crystal can be obtained with higher quality with much less dislocation density, in comparison with group 13 nitride crystals formed from aluminum nitride needle-like crystal as the seed crystal according to the conventional crystal manufacturing method.

Example B3

Example of Manufacturing C-Plane Substrate

A c-plane substrate was fabricated under the same conditions of Example B1 except that the group 13 nitride crystal manufactured by Example A2 was used instead of the group 13 nitride crystal manufactured by Example A1. The same result as Example B1 was obtained.

Comparative Example B1

A c-plane substrate was fabricated under the same conditions of Example B1 except that the group 13 nitride crystal manufactured by Comparative Example A1 was used instead of the group 13 nitride crystal manufactured by Example A1.

As a result, the dislocation density of the seed crystal part was in the order of $10^8$ cm$^{-2}$, the dislocation density of the third region 25d was in the order of $10^6$ cm$^{-2}$. The obtained group 13 nitride crystal was of lower quality in comparison with Examples B1 to B3.

According to the invention, it is possible to obtain a high quality group 13 nitride crystal and substrate thereof.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A group 13 nitride crystal having a hexagonal crystal structure and at least containing nitrogen atom and at least a kind of metal atoms selected from a group consisting of B, Al, Ga, In, and Tl, the group 13 nitride crystal comprising:
   a first region located at an inner side of a cross section intersecting a c-axis; and
   a second region surrounding at least a part of an outer periphery of the first region, having a thickness larger than a maximum diameter of the first region,
   wherein a carrier density is greater in the second region than in the first region when measured at the cross section intersecting the c-axis, and
   wherein the second region includes
      a plurality of segmented regions; and
      a boundary region located, on the cross section intersecting the c-axis, at a boundary among the plurality of segmented regions, and having the carrier density greater than that of regions continuous to the boundary and within the crystal, and
   wherein the first region includes
      a third region located at an inner side of the cross section, and
      a fourth region surrounding at least a part of the third region, and
   wherein in an emission spectrum of the third region by electron beam or ultraviolet light excitation, a first peak including band edge emission of gallium nitride has a peak intensity smaller than that of a second peak which appears in a longer wavelength area than that of the first peak,
   wherein in an emission spectrum of the fourth region by electron beam or ultraviolet light excitation, a first peak including band edge emission of gallium nitride has a peak intensity greater than that of a second peak which appears in a longer wavelength area than that of the first peak, and
   wherein the second peak of the emission spectrum corresponds to emission due to impurities or defects, and the third region has relatively greater amount of impurities or defects than that of the fourth region.

2. The group 13 nitride crystal according to claim 1, wherein the plurality of segmented regions have a uniform carrier density.

3. A group 13 nitride crystal substrate comprising at least the second region of the group 13 nitride crystal according to claim 1.

4. A group 13 nitride crystal having a hexagonal crystal structure and at least containing nitrogen atom and at least a kind of metal atoms selected from a group consisting of B, Al, Ga, In, and Tl, the group 13 nitride crystal comprising:
   a first region located at an inner side of a cross section intersecting a c-axis; and
   a second region surrounding at least a part of an outer periphery of the first region, having a thickness larger than a maximum diameter of the first region,
   wherein a carrier density is greater in the second region than in the first region when measured at the cross section intersecting the c-axis, and
   wherein the first region includes
      a third region located at an inner side of the cross section, and
      a fourth region surrounding at least a part of the third region, and
   wherein in an emission spectrum of the third region by electron beam or ultraviolet light excitation, a first peak including band edge emission of gallium nitride has a peak intensity smaller than that of a second peak which appears in a longer wavelength area than that of the first peak,
   wherein in an emission spectrum of the fourth region by electron beam or ultraviolet light excitation, a first peak including band edge emission of gallium nitride has a peak intensity greater than that of a second peak which appears in a longer wavelength area than that of the first peak, and
   wherein the second peak of the emission spectrum corresponds to emission due to impurities or defects, and the third region has relatively greater amount of impurities or defects than that of the fourth region.

5. The group 13 nitride crystal according to claim 4, wherein the first region and the second region contain a same 13 group element.

6. The group 13 nitride crystal according to claim 1, wherein the first region and the second region contain a same 13 group element.

7. The group 13 nitride crystal according to claim 1, wherein the maximum diameter of the first region is 100 μm or greater.

8. The group 13 nitride crystal according to claim 4, wherein the maximum diameter of the first region is 100 μm or greater.

* * * * *